(12) United States Patent
Yamazaki et al.

(10) Patent No.: US 11,243,420 B2
(45) Date of Patent: Feb. 8, 2022

(54) LIQUID CRYSTAL DISPLAY DEVICE AND MANUFACTURING METHOD THEREOF

(71) Applicant: Semiconductor Energy Laboratory Co., Ltd., Atsugi (JP)

(72) Inventors: Shunpei Yamazaki, Setagaya (JP); Tetsuji Ishitani, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 147 days.

(21) Appl. No.: 16/207,578

(22) Filed: Dec. 3, 2018

(65) Prior Publication Data

US 2019/0113780 A1 Apr. 18, 2019

Related U.S. Application Data

(63) Continuation of application No. 15/698,909, filed on Sep. 8, 2017, which is a continuation of application (Continued)

(30) Foreign Application Priority Data

Apr. 7, 2009 (JP) .................................. 2009-093392

(51) Int. Cl.
  *G02F 1/13* (2006.01)
  *G02F 1/1333* (2006.01)
  *H01L 27/12* (2006.01)

(52) U.S. Cl.
  CPC ...... *G02F 1/1303* (2013.01); *G02F 1/133305* (2013.01); *H01L 27/1218* (2013.01); *H01L 27/1266* (2013.01)

(58) Field of Classification Search
  CPC .................. G02F 1/1303; G02F 1/133305
  See application file for complete search history.

(56) References Cited

U.S. PATENT DOCUMENTS 4,111,533 A * 9/1978 Nakamura ........ G02F 1/133528
  349/58
4,425,030 A * 1/1984 Schmidt ............... C08G 61/025
  349/122

(Continued)

FOREIGN PATENT DOCUMENTS

| EP | 1115102 A | 7/2001 |
| EP | 1383165 A | 1/2004 |

(Continued)

OTHER PUBLICATIONS

Asano.A et al., "43.2:Low-Temperature Polycrystalline-Silicon TFT Color LCD Panel Made of Plastic Substrates", SID Digest '02 : SID International Symposium Digest of Technical Papers, 2002, vol. 33, pp. 1196-1199.

(Continued)

*Primary Examiner* — Chris H Chu
(74) *Attorney, Agent, or Firm* — Robinson Intellectual Property Law Office; Eric J. Robinson

(57) ABSTRACT

Disclosed is a liquid crystal display device which can be used in a variety of situations and applications. The liquid crystal display device comprises: a first substrate comprising a first display region, a second display region, and a third display region wherein the first display region, the second display region, and the third display region are continuously formed; a second substrate having a form which fits the first substrate; and a liquid crystal interposed between the first substrate and the second substrate. The second display region is interposed between the first display region and the second display region. The second display region is curved, and the first display region and the second display region are substantially flat.

3 Claims, 15 Drawing Sheets

Related U.S. Application Data

No. 12/731,482, filed on Mar. 25, 2010, now abandoned.

(56) References Cited

U.S. PATENT DOCUMENTS

| | | | |
|---|---|---|---|
| 4,674,840 A | 6/1987 | Bennett | |
| 4,709,991 A * | 12/1987 | Hoshikawa | G02F 1/1333 349/113 |
| 5,148,248 A | 9/1992 | Possin et al. | |
| 5,273,475 A | 12/1993 | Oshikawa | |
| 5,317,432 A | 5/1994 | Ino | |
| 5,336,535 A | 8/1994 | Fukuchi et al. | |
| 5,646,756 A * | 7/1997 | Dohjo | G02F 1/1362 349/42 |
| 5,650,363 A | 7/1997 | Endroes et al. | |
| 5,897,182 A * | 4/1999 | Miyawaki | G02F 1/136286 345/93 |
| 6,020,271 A | 2/2000 | Yanagida | |
| 6,035,180 A | 3/2000 | Kubes et al. | |
| 6,061,105 A * | 5/2000 | Nakagawa | G02F 1/1339 349/139 |
| 6,125,286 A | 9/2000 | Jahagirdar et al. | |
| 6,140,980 A | 10/2000 | Spitzer et al. | |
| 6,160,346 A | 12/2000 | Vleggaar et al. | |
| 6,190,937 B1 | 2/2001 | Nakagawa et al. | |
| 6,214,261 B1 * | 4/2001 | Smarto | B29C 70/76 156/107 |
| 6,246,469 B1 | 6/2001 | Schier | |
| 6,304,763 B1 | 10/2001 | Jahagirdar et al. | |
| 6,423,614 B1 | 7/2002 | Doyle | |
| 6,558,008 B1 | 5/2003 | Salerno et al. | |
| 6,573,652 B1 | 6/2003 | Graff et al. | |
| 6,627,518 B1 | 9/2003 | Inoue et al. | |
| 6,664,730 B2 | 12/2003 | Weaver | |
| 6,677,254 B2 | 1/2004 | Narwankar et al. | |
| 6,773,129 B2 | 8/2004 | Anderson et al. | |
| 6,831,727 B2 | 12/2004 | Akiyama et al. | |
| 6,945,678 B2 | 9/2005 | Sugihara et al. | |
| 6,956,638 B2 | 10/2005 | Akiyama et al. | |
| 6,977,710 B2 | 12/2005 | Akiyama et al. | |
| 7,027,110 B2 | 4/2006 | Akiyama et al. | |
| 7,119,364 B2 | 10/2006 | Yamazaki | |
| 7,122,445 B2 | 10/2006 | Takayama et al. | |
| 7,166,006 B2 | 1/2007 | Cok | |
| 7,190,503 B2 | 3/2007 | Ide | |
| 7,242,445 B2 | 7/2007 | Akiyama et al. | |
| 7,348,222 B2 | 3/2008 | Shimomura et al. | |
| 7,375,006 B2 | 5/2008 | Takayama et al. | |
| 7,425,931 B1 | 9/2008 | Yamazaki et al. | |
| 7,445,825 B2 | 11/2008 | Wolk et al. | |
| 7,551,345 B2 * | 6/2009 | Uchida | G02F 1/167 359/296 |
| 7,576,362 B2 | 8/2009 | Takayama et al. | |
| 7,611,965 B2 | 11/2009 | Suzuki et al. | |
| 7,666,719 B2 | 2/2010 | Takayama et al. | |
| 7,745,252 B2 | 6/2010 | Suzuki et al. | |
| 7,847,912 B2 | 12/2010 | Nishizawa et al. | |
| 7,852,620 B2 * | 12/2010 | Kanbayashi | H05K 5/069 349/139 |
| 7,884,808 B2 | 2/2011 | Joo | |
| 7,920,223 B2 | 4/2011 | Nishizawa et al. | |
| 7,973,749 B2 * | 7/2011 | Uehara | G02F 1/1323 345/102 |
| 8,044,397 B2 | 10/2011 | Takayama et al. | |
| 8,199,269 B2 | 6/2012 | Hattori et al. | |
| 8,462,289 B2 | 6/2013 | Nishizawa et al. | |
| 8,878,757 B2 | 11/2014 | Yoshida et al. | |
| 8,911,653 B2 | 12/2014 | Yamazaki et al. | |
| 9,178,182 B2 | 11/2015 | Takayama et al. | |
| 9,640,778 B2 | 5/2017 | Takayama et al. | |
| 10,186,682 B2 | 1/2019 | Takayama et al. | |
| 10,727,437 B2 | 7/2020 | Takayama et al. | |
| 2001/0005257 A1 * | 6/2001 | Yamada | G02F 1/133512 349/158 |
| 2001/0033347 A1 | 10/2001 | Kitahora et al. | |
| 2002/0003711 A1 * | 1/2002 | Hashimoto | G02B 6/0028 362/551 |
| 2002/0027636 A1 * | 3/2002 | Yamada | G02F 1/133305 349/155 |
| 2003/0134488 A1 | 7/2003 | Yamazaki et al. | |
| 2003/0152717 A1 * | 8/2003 | Kawahara | G02B 5/3033 428/1.31 |
| 2003/0162312 A1 | 8/2003 | Takayama et al. | |
| 2003/0201974 A1 | 10/2003 | Yin | |
| 2004/0057004 A1 * | 3/2004 | Kadotani | G02F 1/134363 349/141 |
| 2004/0150629 A1 * | 8/2004 | Lee | G06F 3/041 345/173 |
| 2004/0212759 A1 * | 10/2004 | Hayashi | H01L 51/5253 349/84 |
| 2004/0233374 A1 | 11/2004 | Yamazaki et al. | |
| 2005/0012723 A1 | 1/2005 | Pallakoff | |
| 2005/0164470 A1 | 7/2005 | Yamazaki et al. | |
| 2005/0179852 A1 * | 8/2005 | Kawai | G02F 1/133305 349/153 |
| 2005/0274916 A1 * | 12/2005 | Shoji | B32B 3/00 250/580 |
| 2006/0216909 A1 | 9/2006 | Yamazaki et al. | |
| 2007/0085138 A1 | 4/2007 | Yamazaki et al. | |
| 2007/0176887 A1 * | 8/2007 | Uehara | G02F 1/1323 345/102 |
| 2007/0279366 A1 * | 12/2007 | Kageyama | G09G 3/3648 345/100 |
| 2008/0002161 A1 * | 1/2008 | Streid | G03B 21/32 353/98 |
| 2008/0042997 A1 * | 2/2008 | Endo | G06F 3/045 345/176 |
| 2008/0049437 A1 | 2/2008 | Takayama et al. | |
| 2008/0180629 A1 | 7/2008 | Fukai et al. | |
| 2008/0223708 A1 | 9/2008 | Joo | |
| 2008/0291225 A1 | 11/2008 | Arneson | |
| 2008/0298083 A1 | 12/2008 | Watson et al. | |
| 2009/0021677 A1 * | 1/2009 | Nakagawa | G02B 5/3016 349/117 |
| 2009/0085831 A1 | 4/2009 | Odoi et al. | |
| 2009/0122223 A1 * | 5/2009 | Hayano | G02F 1/133305 349/58 |
| 2009/0124062 A1 | 5/2009 | Yamazaki et al. | |
| 2009/0161048 A1 * | 6/2009 | Satake | G02F 1/133305 349/110 |
| 2010/0065845 A1 | 3/2010 | Nakayama | |
| 2010/0117999 A1 | 5/2010 | Matsunaga et al. | |
| 2010/0253902 A1 | 10/2010 | Yamazaki et al. | |
| 2011/0068492 A1 * | 3/2011 | Chen | G02F 1/1303 264/1.7 |
| 2011/0299025 A1 * | 12/2011 | Sahouani | A61F 9/067 349/194 |
| 2015/0130857 A1 | 5/2015 | Yoshida et al. | |
| 2020/0328372 A1 | 10/2020 | Takayama et al. | |

FOREIGN PATENT DOCUMENTS

| | | |
|---|---|---|
| EP | 1760776 A | 3/2007 |
| EP | 1760798 A | 3/2007 |
| EP | 1971111 A | 9/2008 |
| JP | 58-186720 A | 10/1983 |
| JP | 59-105614 A | 6/1984 |
| JP | 63-018327 A | 1/1988 |
| JP | 01-147518 A | 6/1989 |
| JP | 01-287529 A | 11/1989 |
| JP | 02-003530 B | 1/1990 |
| JP | 03-065925 A | 3/1991 |
| JP | 04-018525 A | 1/1992 |
| JP | 04-043389 A | 2/1992 |
| JP | 04-170519 A | 6/1992 |
| JP | 04-250424 A | 9/1992 |
| JP | 05-127154 A | 5/1993 |
| JP | 06-214220 A | 8/1994 |
| JP | 07-114347 A | 5/1995 |
| JP | 08-278491 A | 10/1996 |
| JP | 10-020293 A | 1/1998 |

(56) References Cited

FOREIGN PATENT DOCUMENTS

| | | |
|---|---|---|
| JP | 10-095189 A | 4/1998 |
| JP | 10-268268 A | 10/1998 |
| JP | 10-268270 A | 10/1998 |
| JP | 11-017579 A | 1/1999 |
| JP | 11-038395 A | 2/1999 |
| JP | 2001-117069 A | 4/2001 |
| JP | 2001-122544 A | 5/2001 |
| JP | 2001-166301 A | 6/2001 |
| JP | 2001-519585 | 10/2001 |
| JP | 2002-006293 A | 1/2002 |
| JP | 2002-072179 A | 3/2002 |
| JP | 2002-280170 A | 9/2002 |
| JP | 2002-341792 A | 11/2002 |
| JP | 2003-258211 A | 9/2003 |
| JP | 2003-338859 A | 11/2003 |
| JP | 2003-345286 A | 12/2003 |
| JP | 2004-072050 A | 3/2004 |
| JP | 2004-279867 A | 10/2004 |
| JP | 2004-281182 A | 10/2004 |
| JP | 2004-354468 A | 12/2004 |
| JP | 2005-018492 A | 1/2005 |
| JP | 2005-039249 A | 2/2005 |
| JP | 2005-134460 A | 5/2005 |
| JP | 2005-134461 A | 5/2005 |
| JP | 2005-227450 A | 8/2005 |
| JP | 2006-005712 A | 1/2006 |
| JP | 3875130 | 1/2007 |
| JP | 2007-096276 A | 4/2007 |
| JP | 2007-096277 A | 4/2007 |
| JP | 2007-326259 A | 12/2007 |
| JP | 2007-333818 A | 12/2007 |
| JP | 2008-159309 A | 7/2008 |
| JP | 2008-245160 A | 10/2008 |
| JP | 2008-276212 A | 11/2008 |
| JP | 2008-304535 A | 12/2008 |
| JP | 2009-020168 A | 1/2009 |
| JP | 2009-021322 A | 1/2009 |
| JP | 2009-031742 A | 2/2009 |
| JP | 2010-262275 A | 11/2010 |
| JP | 2014-160290 A | 9/2014 |
| JP | 5938437 | 6/2016 |
| JP | 6203903 | 9/2017 |
| KR | 2004-0010186 A | 1/2004 |
| KR | 2005-0040720 A | 5/2005 |
| KR | 2007-0102279 A | 10/2007 |
| KR | 2008-0018728 A | 2/2008 |
| KR | 2008-0025311 A | 3/2008 |
| KR | 2008-0084497 A | 9/2008 |
| KR | 2009-0006735 A | 1/2009 |
| WO | WO-1998/039176 | 9/1998 |
| WO | WO-1999/018590 | 4/1999 |
| WO | WO-2008/126878 | 10/2008 |
| WO | WO-2008/126884 | 10/2008 |

OTHER PUBLICATIONS

Korean Office Action (Application No. 2010-0030212) dated Mar. 21, 2016.
Korean Office Action (Application No. 2016-0135632) dated Nov. 16, 2016.
Korean Office Action (Application No. 2016-0135632) dated Mar. 17, 2017.
Korean Office Action (Application No. 2017-0074664) dated Jul. 11, 2017.
Korean Office Action (Application No. 2017-0074664) dated Jan. 9, 2018.

\* cited by examiner

FIG. 11A1
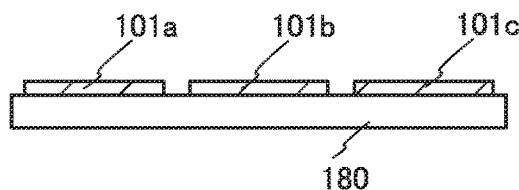
FIG. 11A2
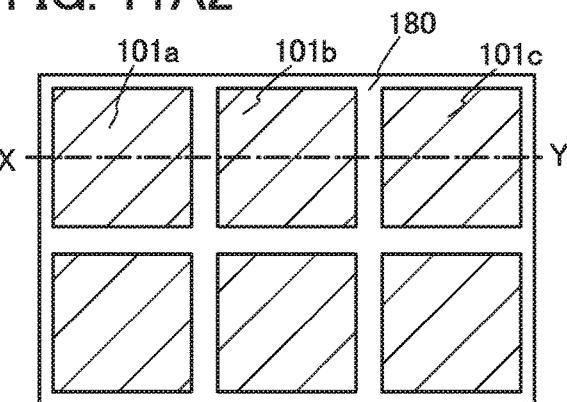
FIG. 11B1
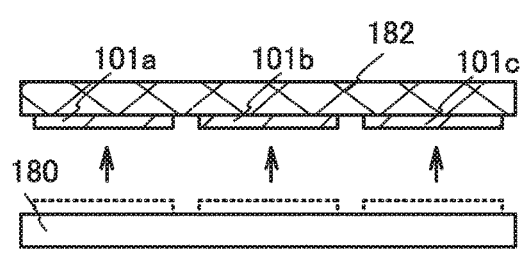
FIG. 11B2
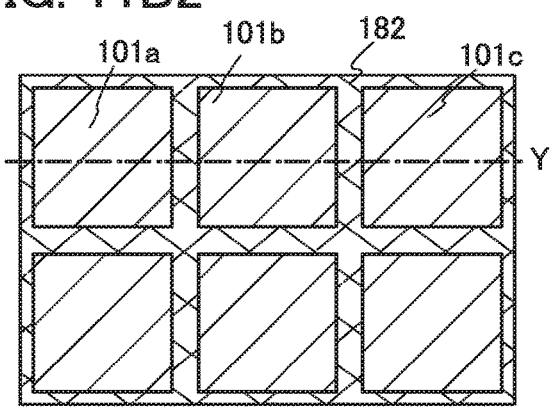
FIG. 11C1
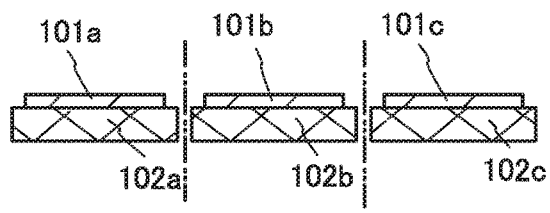
FIG. 11C2
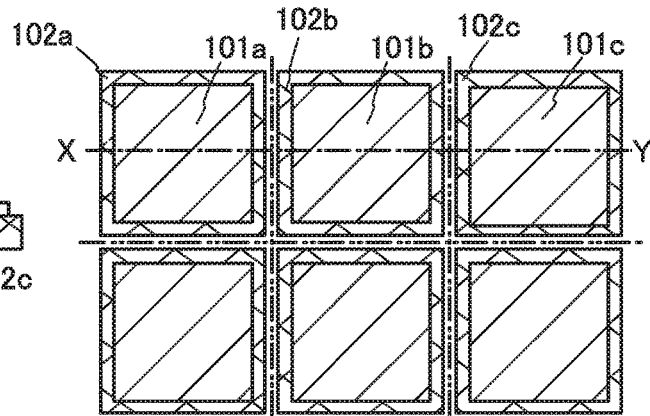

FIG. 14A
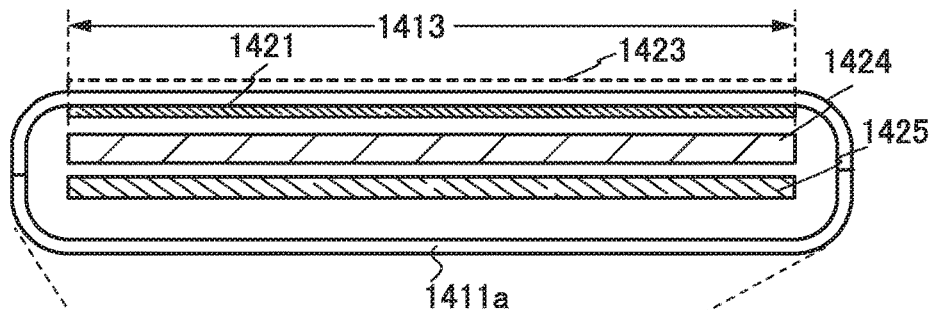
FIG. 14B
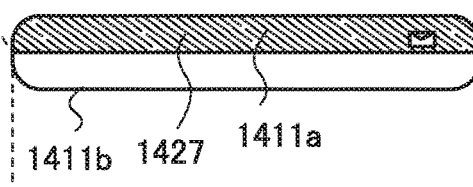
FIG. 14C
FIG. 14D
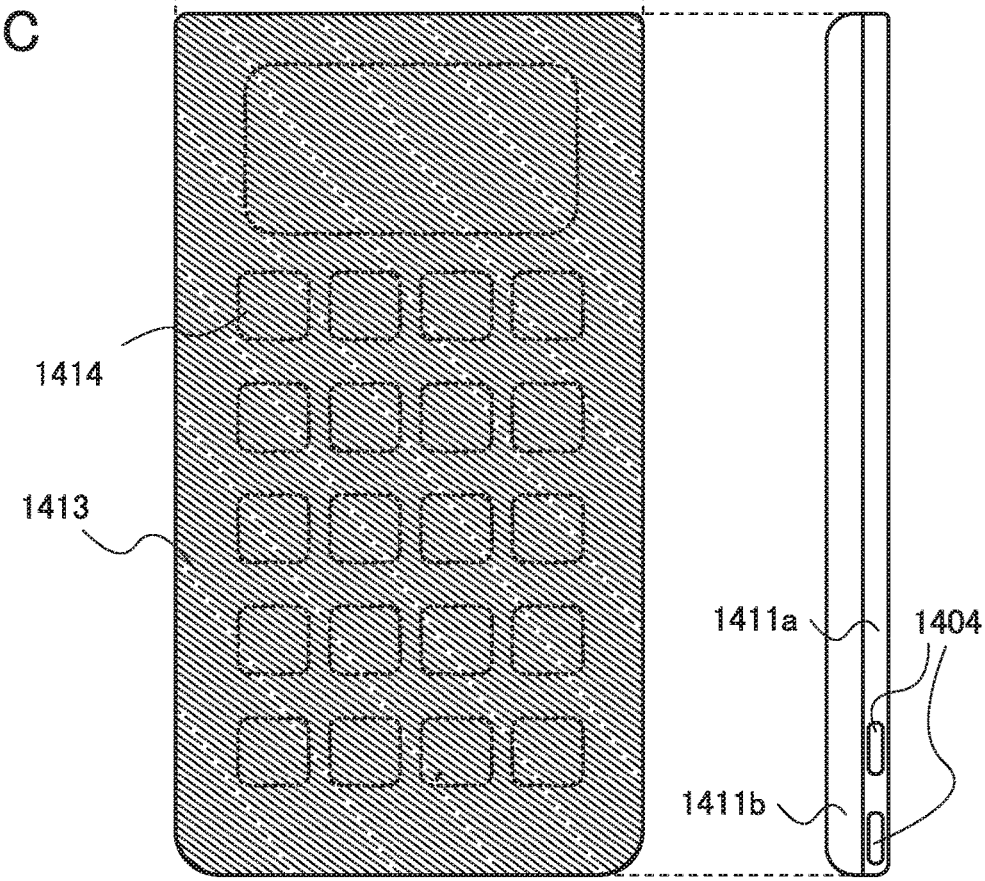

LIQUID CRYSTAL DISPLAY DEVICE AND MANUFACTURING METHOD THEREOF

BACKGROUND OF THE INVENTION

1. Field of the Invention

The present invention relates to a liquid crystal display device and a method for manufacturing the same.

2. Description of the Related Art

In recent years, display devices have been used in a variety of places for a variety of applications and therefore have been required to have diverse characteristics and shapes. Accordingly, display devices serving their intended purposes have been actively developed.

For example, a liquid crystal panel using a plastic substrate has been produced to reduce the weight thereof (e.g., see Non-Patent Document 1).

REFERENCE

[Non-Patent Document 1] Akihiko ASANO and Tomoatsu KINOSHITA, SID DIGEST, 2002, pp. 1196-1199

SUMMARY OF THE INVENTION

Thus, an object of one embodiment of the present invention is to provide a more convenient liquid crystal display device which can be used for a variety of applications. Another object of one embodiment of the present invention is to manufacture, without complicating the process, a liquid crystal display device having a shape suitable for its intended purpose.

In the manufacturing process of the liquid crystal display device, the liquid crystal display device is shaped after the manufacture of an electrode layer and an element layer, thereby having a more useful function.

The shape of the liquid crystal display device can be freely determined by selecting the shape of a mold used for shaping the liquid crystal display device. Accordingly, it is possible to manufacture various kinds of liquid crystal display devices capable of being used in a variety of places for a variety of applications, which allows a convenient liquid crystal display device to be provided.

One embodiment of the invention disclosed in this specification includes: a supporting member that is at least partly curved; and a liquid crystal display panel that includes a liquid crystal material sealed between a pair of flexible substrates and is provided in contact with an inner surface of the supporting member.

Another embodiment of the invention disclosed in this specification includes: a supporting member that has a curved portion and has a first surface and a second surface with the curved portion therebetween; and a liquid crystal display panel that includes a liquid crystal material sealed between a pair of flexible substrates and is provided in contact with an inner surface of the supporting member. The liquid crystal display panel has a first display area, a second display area, and a third display area which are formed continuously, and the first display area is faces the first surface of the supporting member, the second display area faces the second surface of the supporting member, and the third display area faces the curved portion of the supporting member.

A still another embodiment of the invention disclosed in this specification includes: a first substrate that is at least partly curved; a second substrate fitting into the first substrate with a spacer interposed therebetween; and a liquid crystal material filling a space between the first substrate and the second substrate.

A further embodiment of the invention disclosed in this specification includes: a first substrate that is at least partly curved; a second substrate fitting into the first substrate with a spacer interposed therebetween; and a liquid crystal material filling a space between the first substrate and the second substrate. A first display area is formed on one of the surfaces holding the curved portion therebetween, and a second display area is formed on the other surface. A third display area is formed on the curved surface. The first display area and the second display area may be substantially flat, and a plane of the first display area may be perpendicular to a plane of the second display area.

A manufacturing method of a liquid crystal display having the above-mentioned structure is also included in an embodiment of the invention.

In the above structures, the liquid crystal display device may be provided with a protective film. The protective film may be formed to cover the outside of the liquid crystal display panel, or may be formed between a liquid crystal layer and each of the first substrate and the second substrate. The liquid crystal display device may include a sensor portion. For example, a touch sensor (a touch screen) can be provided in a supporting member on the viewer side.

In the case of a transmissive liquid crystal display device, a backlight may be provided to light a display area. The backlight is preferably curved in accordance with the shape of the liquid crystal display device.

Note that the ordinal numbers such as "first" and "second" are used for convenience and do not denote the order of steps and the stacking order of layers. In addition, the ordinal numbers in this specification do not denote particular names which specify the present invention.

Note that a semiconductor device in this specification refers to all the devices that can operate by using semiconductor characteristics, and an electro-optical device, a semiconductor circuit, and an electronic appliance are all included in the semiconductor device.

The shape of the liquid crystal display device can be freely determined by selecting the shape of the mold used for shaping the liquid crystal display device. Accordingly, it is possible to manufacture various kinds of liquid crystal display devices capable of being used in a variety of places for a variety of applications, which allows a convenient liquid crystal display device to be provided.

BRIEF DESCRIPTION OF THE DRAWINGS

In the accompanying drawings:

FIGS. 11A1 to 11C2 are diagrams illustrating a method for manufacturing a liquid crystal display device;

FIGS. 14A to 14D are diagrams illustrating an example of a cellular phone using a liquid crystal display device.

DETAILED DESCRIPTION OF THE INVENTION

Figure 1A:
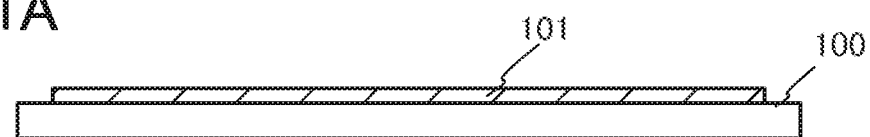
FIGS. 1A to 1D are diagrams illustrating a method for manufacturing a liquid crystal display device.
Figure 1B:
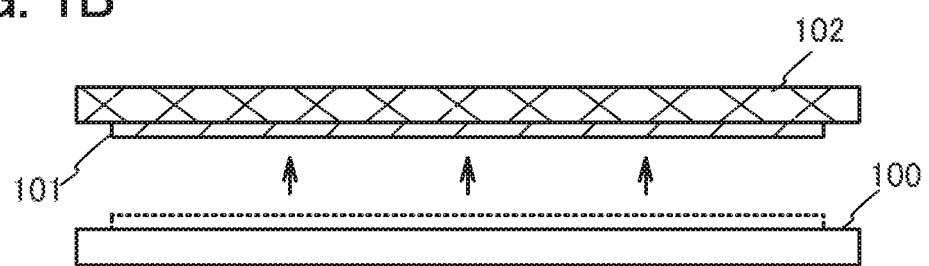

Embodiments of the present invention will be described in detail with reference to drawings. Note that the present invention is not limited to the description below, and it is apparent to those skilled in the art that modes and details can be modified in various ways without departing from the spirit and scope of the present invention. Accordingly, the present invention should not be construed as being limited to the description of the embodiments given below. Note that in the structures of the present invention described below, like portions or portions having a similar function are denoted by the same reference numerals, and the description thereof is omitted.

Embodiment 1

A liquid crystal display device will be described with reference to FIGS. 1A to 1D, FIGS. 2A to 2C, and FIGS. 3A to 3C.

FIGS. 1A to 1D, FIGS. 2A to 2C, and FIGS. 3A to 3C are cross-sectional views illustrating a method for manufacturing a liquid crystal display device.

The liquid crystal display device includes at least a liquid crystal layer, a pair of substrates holding the liquid crystal layer therebetween, and an electrode layer for applying voltage to the liquid crystal layer. The liquid crystal display device may also be provided with a semiconductor element, preferably a thin film transistor. In the case of an active matrix liquid crystal display device, a driving thin film transistor is provided in each pixel.

Although an active matrix liquid crystal display device is shown as an example in this embodiment, this embodiment can also be applied to a passive matrix liquid crystal display device.

In a manufacturing process of the liquid crystal display device in this embodiment, the liquid crystal display device is shaped after the manufacture of the electrode layer and an element layer, thereby having a more useful function.

An element layer 101 is formed over a manufacturing substrate 100 (see FIG. 1A). The element layer 101 includes a thin film transistor. Next, the element layer 101 is transferred to a supporting substrate 102 (see FIG. 1B).

Figure 1C:
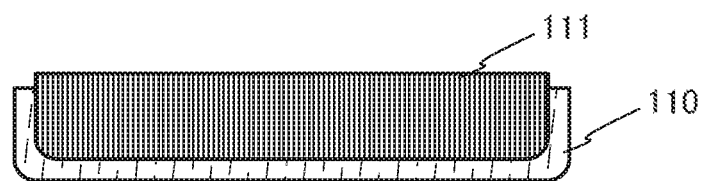

A first substrate 110 is provided along a curved surface of a first support 111 serving as a mold for the liquid crystal display device (see FIG. 1C). The first substrate 110 may be attached to the first support 111 with an adhesive layer or the like. By this step, the first substrate 110 is processed to a form having a curved region and a flat region.

Figure 1D:
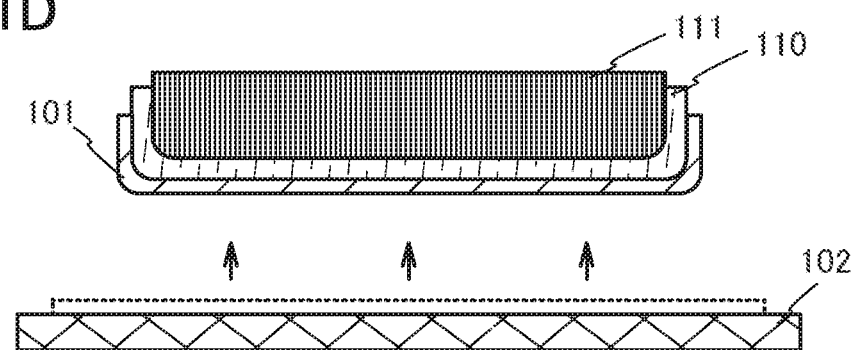

The supporting substrate 102 and the first support 111 are arranged so that the element layer 101 faces the first substrate 110, then, the element layer 101 is transferred to the first substrate 110 side in a direction indicated by arrows (see FIG. 1D). That is, the element layer 101 is transferred from the supporting substrate 102 to a surface of the first substrate which is opposite to a surface contacting with the first support 111.

The manufacturing substrate 100 may be selected as appropriate depending on the manufacturing process of the element layer 101. For example, a glass substrate, a quartz substrate, a sapphire substrate, a ceramic substrate, or a metal substrate having an insulating layer on its surface can be used as the manufacturing substrate 100. It is also possible to use a plastic substrate which is heat resistant to a processing temperature.

Figure 2A:
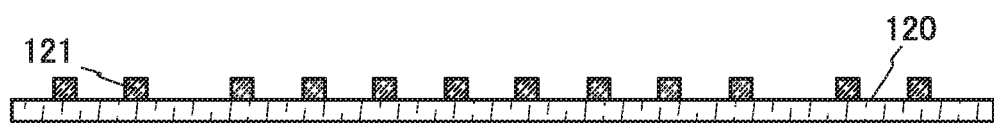
FIGS. 2A to 2C are diagrams illustrating a method for manufacturing a liquid crystal display device.

Spacers 121 are formed on a second substrate 120 (see FIG. 2A). The spacers 121 may be formed on another manufacturing substrate and then transferred to the second substrate 120.

As the supporting substrate 102, the first substrate 110, and the second substrate 120, a substrate having flexibility (a flexible substrate) is used. However, the first substrate 110 and the second substrate 120 that have been shaped and fixed do not need to have flexibility. The supporting substrate 102, the first substrate 110, and the second substrate 120 can be made of an aramid resin, a poly(ethylene naphthalate) (PEN) resin, a poly(ether sulfone) (PES) resin, a poly(phenylene sulfide) (PPS) resin, a polyimide (PI) resin, or the like.

Figure 2B:
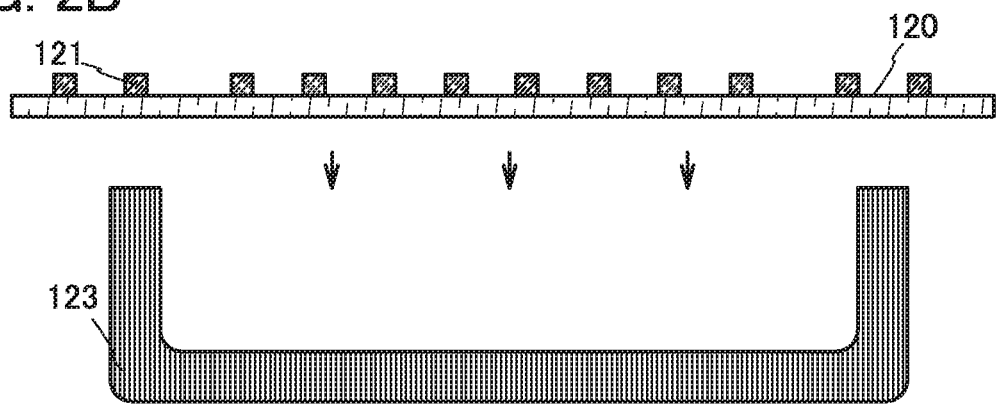

Next, the second substrate 120 provided with the spacers 121 and a second support 123 which has a curved surface at least in a portion thereof are arranged so that a surface of the second substrate 120 on which the spacers 121 are not formed faces the inside of the second support 123 (see FIG. 2B). The second support 123 may have a U-shape.

Figure 2C:
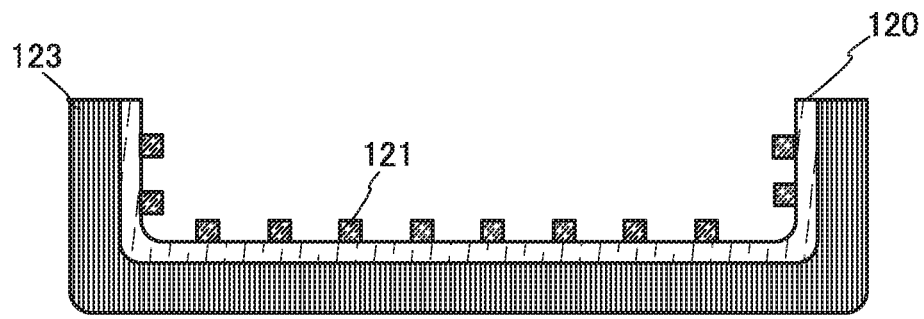

When the second substrate 120 is attached to the inside of the second support 123 in a direction indicated by arrows, the second substrate 120 provided with the spacers 121 is made into a shape similar to that of the second support 123 (see FIG. 2C). By this step, the second substrate 120 is processed to a form having a curved region and a flat region.

Figure 3A:
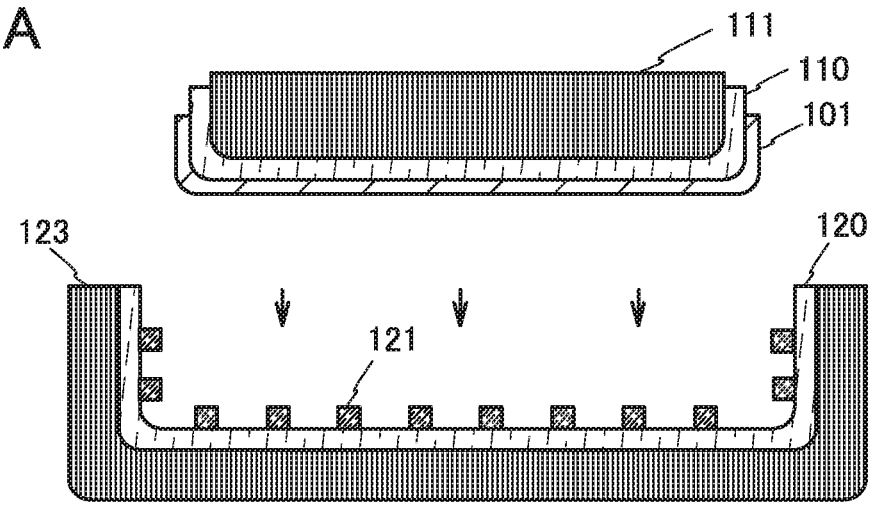
FIGS. 3A to 3C are diagrams illustrating a method for manufacturing a liquid crystal display device.
Figure 3B:
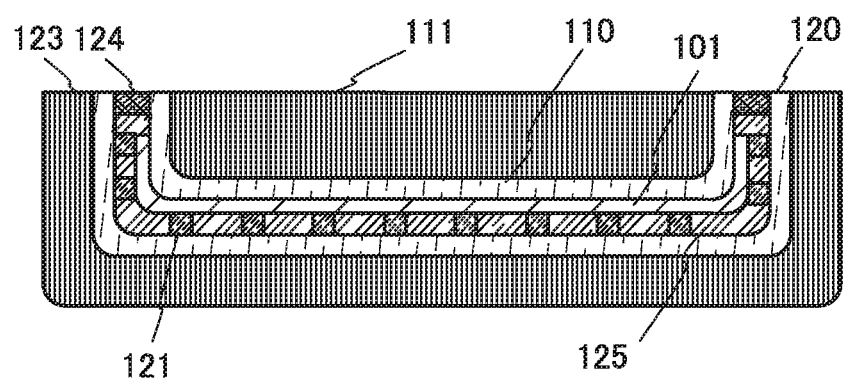

The first support 111 provided with the element layer 101 and the first substrate 110 and the second support 123 provided with the spacers 121 and the second substrate 120 are arranged so that the element layer 101 faces the spacers 121 (see FIG. 3A).

The first support 111 and the second support 123 fit into each other (are combined to each other) in a direction indicated by arrows. Then, with use of a sealant 124, the first substrate 110 is bonded to the second substrate 120 with a liquid crystal layer 125 and the element layer 101 interposed therebetween (see FIG. 3B). This attachment step may be performed under reduced pressure.

As the sealant 124, it is typically preferable to use a visible light curable resin, an ultraviolet light curable resin, or a thermosetting resin. Typically, an acrylic resin, an epoxy resin, an amine resin, or the like can be used. The sealant 124 may include a photopolymerization initiator (typically, an ultraviolet light polymerization initiator), a thermosetting agent, a filler, or a coupling agent.

The liquid crystal layer 125 is formed by filling a space with a liquid crystal material. The liquid crystal layer 125 may be formed by a dispenser method (a dripping method) in which a liquid crystal is dripped before the attachment of the first substrate 110 to the second substrate 120, or by an injection method in which a liquid crystal is injected by using a capillary phenomenon after the attachment of the first substrate 110 to the second substrate 120. There is no particular limitation on the kind of liquid crystal material, and a variety of materials can be used. If a material exhibiting a blue phase is used as the liquid crystal material, an orientation film does not need to be provided.

Figure 3C:
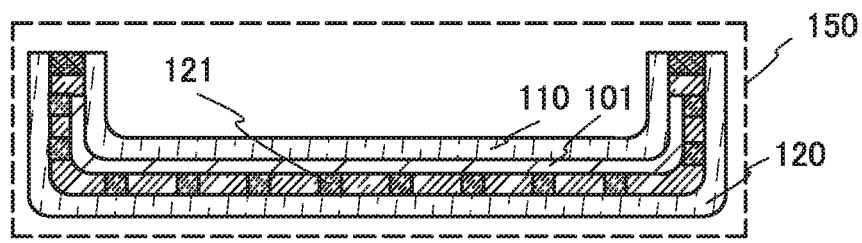

The first support 111 and the second support 123 are removed, whereby a curved liquid crystal display panel 150 that reflects the shape of the first support 111 and the second support 123 can be manufactured (see FIG. 3C).

Although not illustrated in this embodiment, a color filter (a coloring layer), a black matrix (a light-shielding layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a sidelight, or the like may be used as a light source.

When the first substrate 110 and the second substrate 120 are shaped by the first support 111 and the second support 123, they may be subjected to fixing treatment such as heat treatment or light irradiation treatment so that the obtained shape is fixed. Alternatively, the substrate may be shaped by heat treatment and cooled maintaining the obtained shape, so that the shape of the substrate can be fixed.

The element layer 101 may be directly formed on the supporting substrate 102 or the first substrate 110. For example, an electrode layer may be directly formed on the supporting substrate 102 or the first substrate 110 by printing.

There is no particular limitation on the method for transferring the element layer 101 from the manufacturing substrate 100 to another substrate as shown in this embodiment, and a variety of methods can be used. For example, a separation layer may be formed between the manufacturing substrate 100 and the element layer 101.

By sputtering, plasma CVD, coating, printing, or the like, the separation layer is formed with a single layer or staked layers made of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si); or an alloy or a compound containing any of these elements as its main component. A layer containing silicon may have any crystalline structure: an amorphous structure, a microcrystalline structure, or a polycrystalline structure. Note that the coating method includes here a spin coating method, a droplet discharging method, and a dispensing method.

In the case where the separation layer has a single-layer structure, it is preferable to form a tungsten layer, a molybdenum layer, or a layer containing a mixture of tungsten and molybdenum. Alternatively, the separation layer may be a layer containing an oxide or oxynitride of tungsten, a layer containing an oxide or oxynitride of molybdenum, or a layer containing an oxide or oxynitride of a mixture of tungsten and molybdenum. Note that the mixture of tungsten and molybdenum corresponds to, for example, a tungsten-molybdenum alloy.

In the case where the separation layer has a multi-layer structure, it is preferable that a tungsten layer, a molybdenum layer, or a layer containing a mixture of tungsten and molybdenum be formed as a first layer, and a layer containing an oxide, nitride, oxynitride, or nitride oxide of tungsten, molybdenum, or a mixture of tungsten and molybdenum is formed as a second layer.

In the case where the separation layer has a multi-layer structure of a layer containing tungsten and a layer containing an oxide of tungsten, it may be formed in the following manner: a layer containing tungsten is formed and an insulating layer containing an oxide is formed thereover, so that a layer containing an oxide of tungsten can be formed at the interface between the tungsten layer and the insulating layer. Alternatively, a surface of the layer containing tungsten may be subjected to thermal oxidation treatment, oxygen plasma treatment, treatment with a highly oxidizing solution such as ozone-containing water, or the like, so that a layer containing an oxide of tungsten can be formed. The plasma treatment and the thermal treatment may be performed in an atmosphere of oxygen, nitrogen, or dinitrogen monoxide alone, or a mixed gas of any of these gasses and another gas. A layer containing a nitride, oxynitride, or nitride oxide of tungsten may be formed in a manner similar to that used for forming the layer containing an oxide of tungsten: after a layer containing tungsten is formed, a silicon nitride layer, a silicon oxynitride layer, or a silicon nitride oxide layer is formed thereover.

Note that the element layer can be transferred to another substrate by any of the following methods: a method in which a separation layer is formed between a substrate and the element layer and a metal oxide film is formed between the separation layer and the element layer and then weakened by crystallization so that the element layer can be separated; a method in which an amorphous silicon film containing hydrogen is formed between a high heat-resistant substrate and the element layer and then removed by laser light irradiation or etching so that the element layer can be separated; a method in which a separation layer is formed between a substrate and the element layer and a metal oxide film is formed between the separation layer and the element layer and then weakened by crystallization, and after part of the separation layer is etched away using a solution or a halogen-containing gas such as $NF_3$, $BrF_3$, or $ClF_3$, the element layer is separated at the weakened metal oxide film; and a method in which a substrate over which the element layer is formed is mechanically removed or etched away using a solution or a halogen-containing gas such as $NF_3$, $BrF_3$, or $ClF_3$. It is also possible to use a method in which a film containing nitrogen, oxygen, hydrogen, or the like (e.g., an amorphous silicon film containing hydrogen, an alloy film containing hydrogen, or an alloy film containing oxygen) is formed as a separation layer, and the separation layer is irradiated with laser light so that nitrogen, oxygen, hydrogen, or the like contained in the separation layer is released as gas to promote separation.

A combination of the above separation methods further facilitates the transferring step. That is, laser light irradiation, etching of a separation layer with a gas or a solution, and mechanical removal of a portion of the element layer with a sharp knife, scalpel, or the like may be performed so that the separation layer and the element layer can be easily separated from each other, then, the separation step can be achieved by physical force (with a machine or the like).

Alternatively, the interface between the separation layer and the element layer may be soaked with a liquid, whereby the element layer is separated from the substrate.

The shape of the liquid crystal display panel 150 can be freely determined by selecting the shape of the first support 111 and the second support 123. Accordingly, it is possible to manufacture various kinds of liquid crystal display devices capable of being used in a variety of places for a variety of applications, which allows a convenient liquid crystal display device to be provided.

Embodiment 2

In this embodiment, an example of a method for manufacturing the liquid crystal display device shown in Embodiment 1, which is additionally provided with a protective film, will be described with reference to FIGS. 4A to 4D, FIGS. 5A to 5C, and FIGS. 6A to 6C. Therefore, the liquid crystal display device of this embodiment, except the protective film, can be manufactured in a manner similar to that shown in Embodiment 1; thus, description of the same components or components having the same functions as those in Embodiment 1, and the manufacturing process thereof will be omitted.

FIGS. 4A to 4D, FIGS. 5A to 5C, and FIGS. 6A to 6C are cross-sectional views illustrating a method for manufacturing the liquid crystal display device.

In a manufacturing process of the liquid crystal display device in this embodiment, the liquid crystal display device is shaped after the manufacture of an electrode layer and an element layer, thereby having a more useful function. Furthermore, the provision of a protective film increases the reliability of the liquid crystal display device.

Figure 4A:
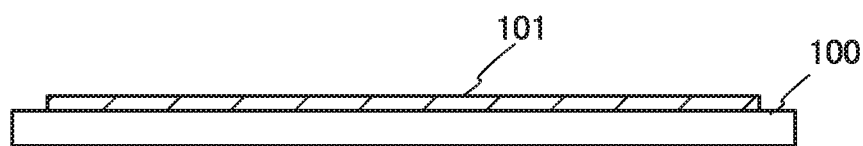
FIGS. 4A to 4D are diagrams illustrating a method for manufacturing a liquid crystal display device.
Figure 4B:
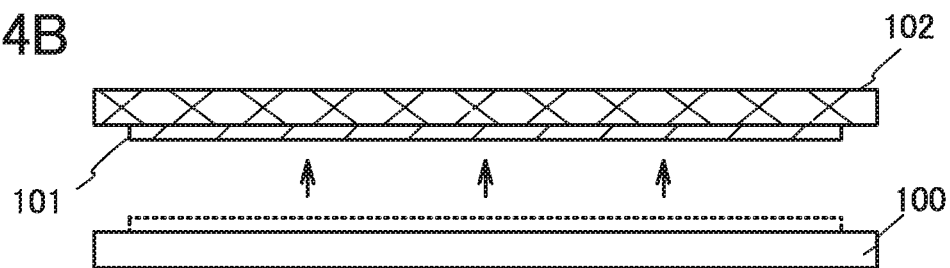

The element layer 101 is formed over the manufacturing substrate 100 (see FIG. 4A). In this embodiment, the element layer 101 includes spacers. Next, the element layer 101, which includes a thin film transistor, is transferred to the supporting substrate 102 (see FIG. 4B).

With use of the first support 111 serving as a mold for the liquid crystal display device, the first substrate 110 is provided along a curved surface of the first support 111. The first substrate 110 may be attached to the first support 111 with an adhesive layer or the like.

Figure 4C:
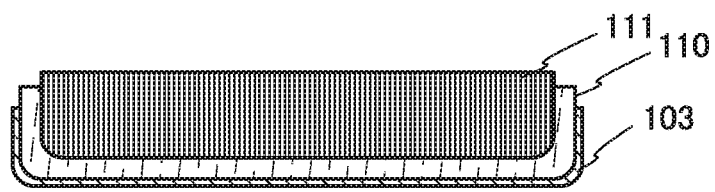

A protective film 103 is formed on the first substrate 110 attached to the first support 111 (see FIG. 4C). The protective film 103 is formed to cover the first substrate 110 that has been bent along the shape of the first support 111. Since the first substrate 110 is not shaped after the formation of the protective film 103, it is possible to prevent defects such as damage of the protective film 103 due to the shaping of the first substrate 110. As a result, the protective film 103 which is a dense film blocks moisture or other impurities from the first substrate 110, and the contamination of the element layer or the liquid crystal layer can be efficiently prevented.

Figure 4D:
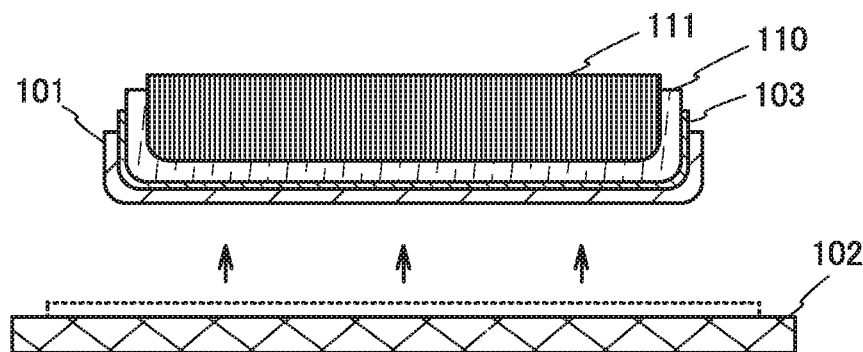

The supporting substrate 102 and the first support 111 are arranged so that the protective film 103 and the first substrate 110 are interposed therebetween, then, the element layer 101 is transferred to the protective film 103 and first substrate 110 side in a direction indicated by arrows (see FIG. 4D).

Figure 5A:
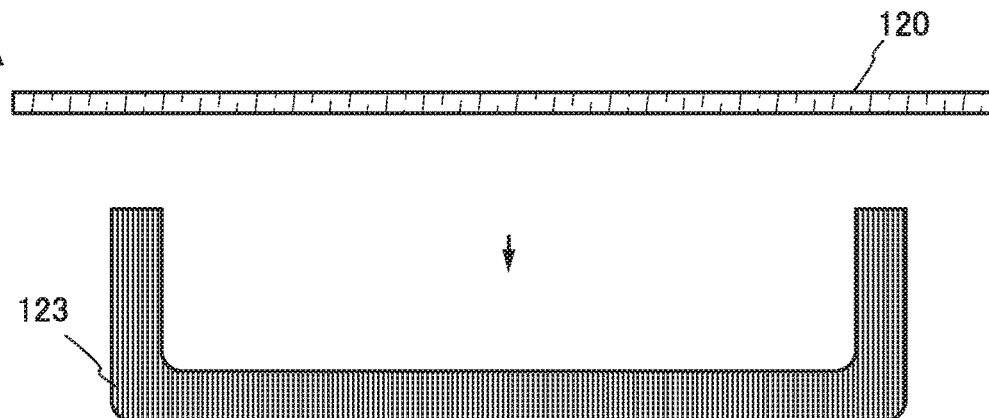
FIGS. 5A to 5C are diagrams illustrating a method for manufacturing a liquid crystal display device.

Next, the second substrate 120 and the second support 123 which has a curved surface at least in a portion thereof are arranged (see FIG. 5A).

Figure 5B:
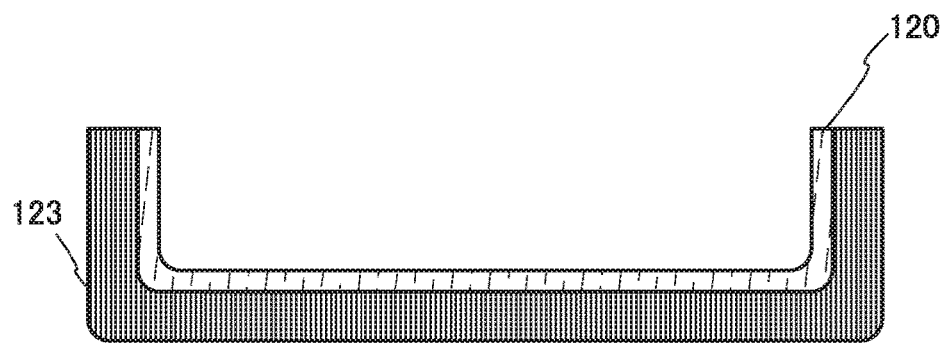

When the second substrate 120 is attached to the inside of the second support 123 in a direction indicated by arrows, the second substrate 120 is made into a shape similar to that of the second support 123 (see FIG. 5B).

Figure 5C:
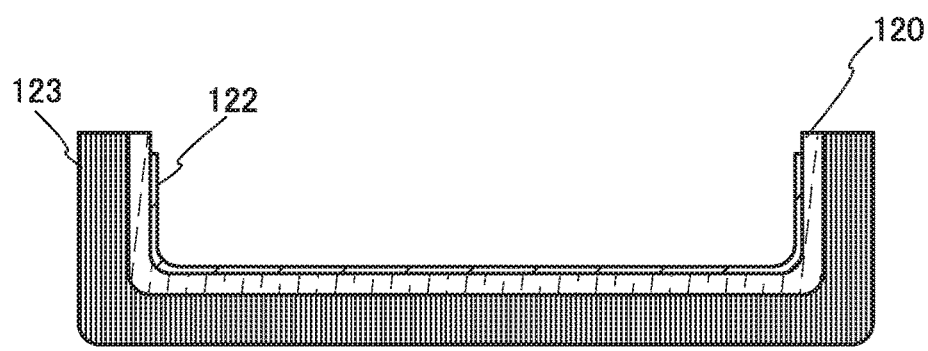

A protective film 122 is formed on the second substrate 120 attached to the second support 123 (see FIG. 5C). The protective film 122 is formed to cover the second substrate 120 that has been bent along the shape of the second support 123. Since the second substrate 120 is not shaped after the formation of the protective film 122, it is possible to prevent defects such as damage of the protective film 122 due to the shaping of the second substrate 120. As a result, the protective film 122 which is a dense film blocks moisture or other impurities from the second substrate 120, and the contamination of the element layer or the liquid crystal layer can be efficiently prevented.

The protective film 103 and the protective film 122 can be formed by sputtering using an inorganic insulating material. Examples of the inorganic insulating material include silicon oxide, silicon nitride, silicon oxynitride, aluminum oxide, aluminum nitride, and aluminum oxynitride.

Figure 6A:
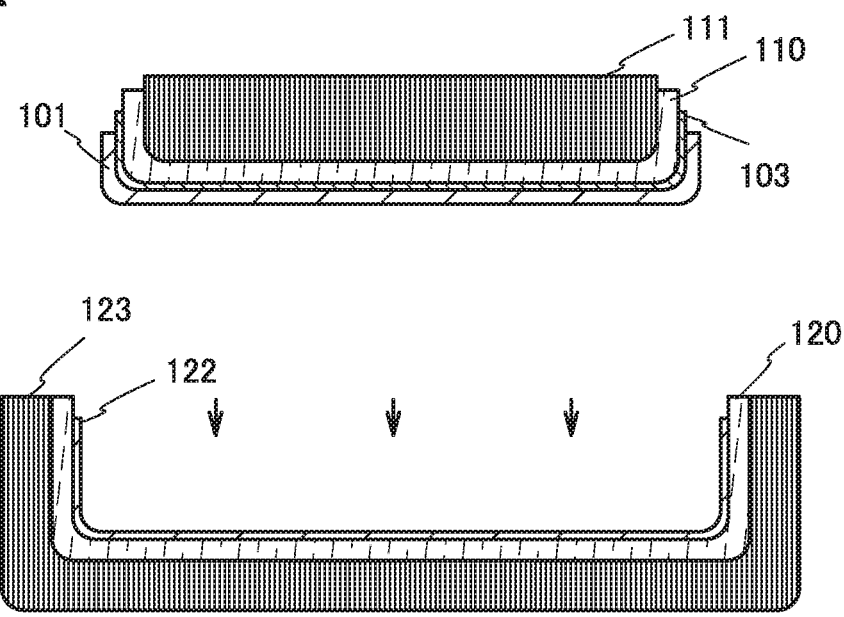
FIGS. 6A to 6C are diagrams illustrating a method for manufacturing a liquid crystal display device.
Figure 6B:
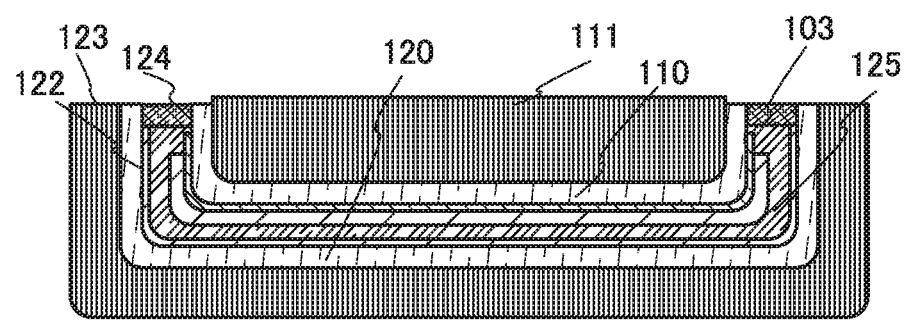

The first support 111 provided with the element layer 101, the protective film 103, and the first substrate 110, and the second support 123 provided with the protective film 122 and the second substrate 120 are arranged so that the element layer 101 faces the protective film 122 (see FIG. 6A).

The first support 111 and the second support 123 are combined to each other in a direction indicated by arrows. Then, with use of the sealant 124, the element layer 101, the protective film 103, and the first substrate 110 are attached to the protective film 122 and the second substrate 120 with the liquid crystal layer 125 interposed therebetween (see FIG. 6B).

Although the spacers formed on the element layer 101 are shown as an example in this embodiment, spherical spacers may be dispersed on the protective film 122.

The liquid crystal layer 125 may be formed by a dispenser method (a dripping method) in which a liquid crystal is dropped before the attachment of the first substrate 110 to the second substrate 120, or by an injection method in which a liquid crystal is injected by using a capillary phenomenon after the attachment of the first substrate 110 to the second substrate 120.

Figure 6C:
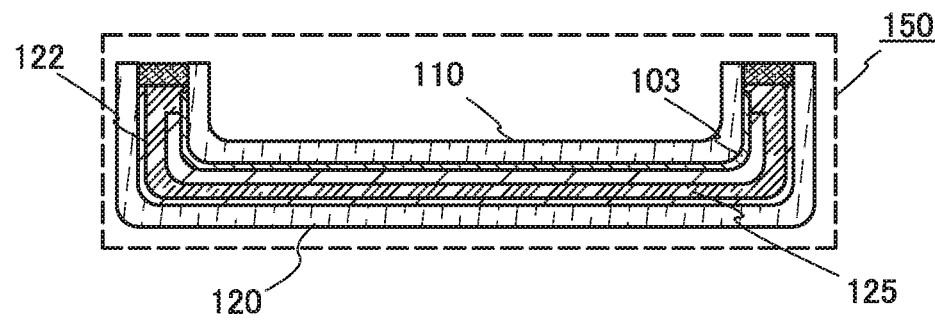

The first support 111 and the second support 123 are removed, whereby the curved liquid crystal display panel 150 that reflects the shape of the first support 111 and the second support 123 can be manufactured (see FIG. 6C).

The shape of the liquid crystal display panel 150 can be freely determined by selecting the shape of the first support 111 and the second support 123. Accordingly, it is possible to manufacture various kinds of liquid crystal display devices capable of being used in a variety of places for a variety of applications, which allows a convenient liquid crystal display device to be provided.

In addition, the protective film protects the element layer and the liquid crystal layer from impurities and thus increases the reliability of the liquid crystal display device.

Embodiment 3

In this embodiment, a method for manufacturing a liquid crystal display device, which is different from that shown in Embodiments 1 and 2, will be described with reference to FIGS. 7A to 7F and FIGS. 8A and 8B. Therefore, the liquid crystal display device of this embodiment, except a different part, can be manufactured in a manner similar to that shown in Embodiment 1; thus, description of the same components or components having the same functions as those in Embodiment 1, and the manufacturing process thereof will be omitted.

FIGS. 7A to 7F and FIGS. 8A and 8B are cross-sectional views illustrating a method for manufacturing the liquid crystal display device.

In a manufacturing process of the liquid crystal display device in this embodiment, the liquid crystal display device is shaped after the attachment of a pair of substrates with a liquid crystal layer interposed therebetween, thereby having a more useful function.

Figure 7A:
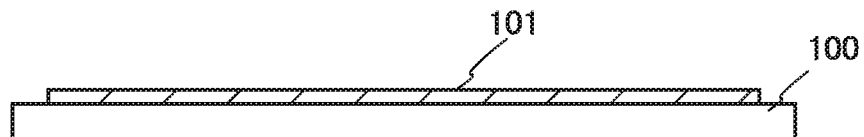
FIGS. 7A to 7F are diagrams illustrating a method for manufacturing a liquid crystal display device.
Figure 7B:
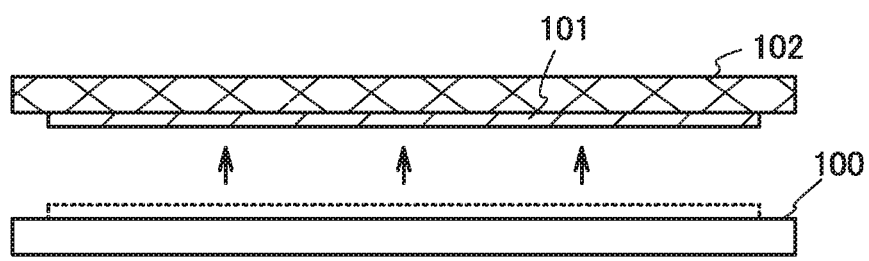

The element layer 101 is formed over the manufacturing substrate 100 (see FIG. 7A). The element layer 101 includes a thin film transistor. Next, the element layer 101 is transferred to the supporting substrate 102 (see FIG. 7B).

Figure 7C:
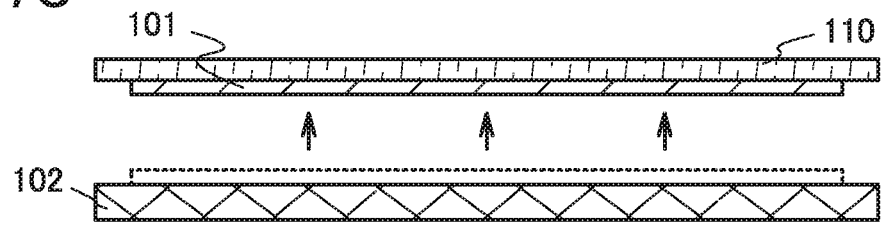

The element layer 101 is transferred from the supporting substrate 102 to the first substrate 110 (see FIG. 7C).

The spacers 121 and the sealant 124 are formed on the second substrate 120. The spacers 121 may be formed on another manufacturing substrate and then transferred to the second substrate 120.

Figure 7D:
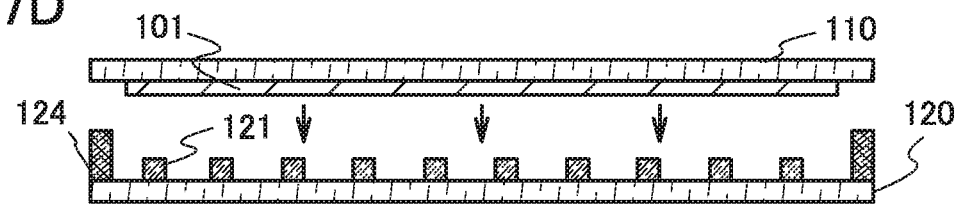

Next, the second substrate 120 provided with the spacers 121 and the first substrate 110 are arranged so that a surface of the second substrate 120 on which the spacers 121 and the sealant 124 are formed faces the element layer 101 (see FIG. 7D).

Figure 7E:
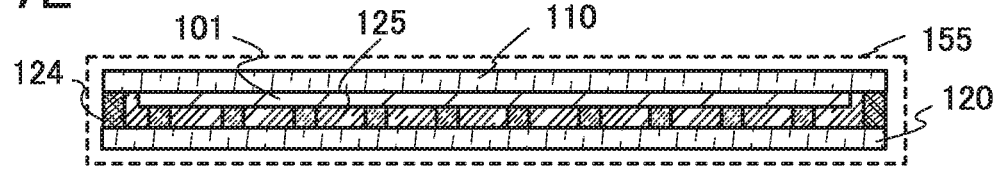

The first substrate 110 is attached to the second substrate 120 with the liquid crystal layer 125 interposed therebetween (see FIG. 7E). Through the above steps, a flexible liquid crystal display panel 155 can be obtained.

Figure 7F:
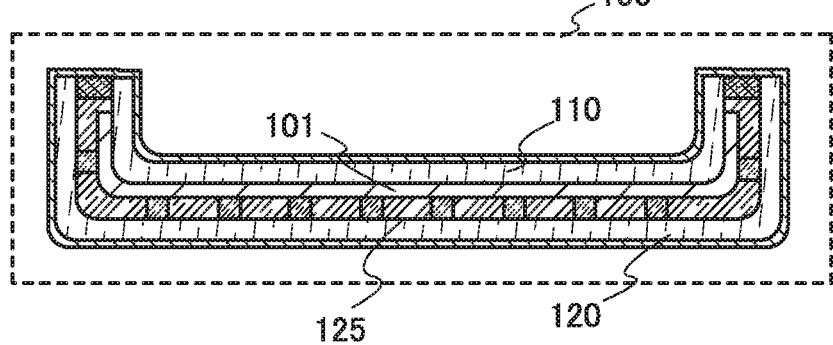

The flexible liquid crystal display panel 155, which is a structure body in which the first substrate 110 faces the second substrate 120 with the liquid crystal layer 125 interposed therebetween, is shaped to be bent, whereby the curved liquid crystal display panel 150 can be manufactured (see FIG. 7F). The liquid crystal display panel may be shaped using the supports 111 and 123 shown in Embodiment 1.

The liquid crystal display panel 155 may be attached to a light-transmitting supporting member so that the liquid crystal display panel 155 can be shaped and fixed.

Figure 8A:
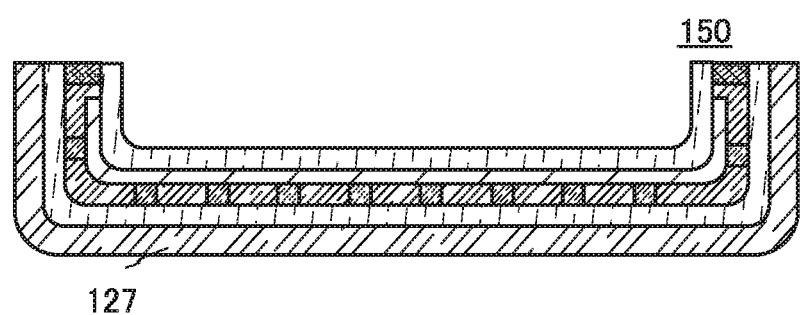
FIGS. 8A and 8B are diagrams illustrating a method for manufacturing a liquid crystal display device.

FIG. 8A illustrates an example in which the flexible liquid crystal display panel 155 manufactured in FIG. 7E is attached to a light-transmitting supporting member 127 and then formed into a curved shape and fixed. The supporting member 127 has a curved portion on a side, and includes a first surface and a second surface with the curved portion therebetween. The liquid crystal display panel 155 is provided in contact with an inner side of the supporting member 127, whereby a first display area and a second display area can be formed respectively on the first surface and the second surface of the supporting member 127. A third display area is also formed in the curved surface of the supporting member 127 and is interposed between the first display area and the second display area. The liquid crystal display panel 155 may be attached to the supporting member 127 with a light-transmitting adhesive layer.

The liquid crystal display panel 150 illustrated in FIG. 7F may be additionally provided with a protective film.

Figure 8B:
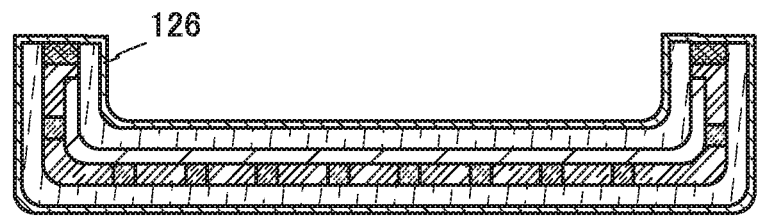

A protective film 126 is formed to surround the liquid crystal display panel 150 (see FIG. 8B).

Since the protective film 126 is formed on the liquid crystal display panel 150 that has been formed into a curved shape, it is possible to prevent defects such as damage of the protective film 126 due to the shaping of the liquid crystal display panel 150. As a result, the protective film 126 which is a dense film blocks moisture or other impurities from the outside, and the contamination of the liquid crystal display panel 150 can be efficiently prevented.

The protective film 126 can be formed by sputtering using an inorganic insulating material. Examples of the inorganic insulating material include silicon oxide, silicon nitride, silicon oxynitride, aluminum oxide, aluminum nitride, and aluminum oxynitride.

The shape of the liquid crystal display panel 150 can be freely determined by selecting the shape of the supporting member 127. Accordingly, it is possible to manufacture various kinds of liquid crystal display devices capable of being used in a variety of places for a variety of applications, which allows a convenient liquid crystal display device to be provided.

In addition, the protective film protects the element layer and the liquid crystal layer from impurities and thus increases the reliability of the liquid crystal display device.

Embodiment 4

In this embodiment, an example of the liquid crystal display device shown in Embodiments 1 to 3, which is additionally provided with an optical member, will be described with reference to FIGS. 9A and 9B. Therefore, the liquid crystal display device of this embodiment, except the optical member, can be manufactured in a manner similar to that shown in Embodiments 1 to 3; thus, description of the same components or components having the same functions as those in Embodiments 1 to 3, and the manufacturing process thereof will be omitted.

The liquid crystal display device shown in Embodiments 1 to 3 can be provided with an optical member. As the optical member, it is possible to use a light source such as a backlight or a sidelight, an optical film (such as a polarizing film, a retardation film, or an anti-reflection film), or the like.

The optical film may be provided on the outside of the first substrate and the second substrate (on the side opposite to the liquid crystal layer) or on the inside thereof (between the liquid crystal layer and each of the first substrate and the second substrate).

For the backlight, a light source such as a cold cathode fluorescent lamp or a light-emitting diode (LED) can be used. A planar light source may be formed using a plurality of LED light sources or a plurality of electroluminescent (EL) light sources. The planar light source may be formed using three or more kinds of LEDs or an LED emitting white light.

Figure 9A:
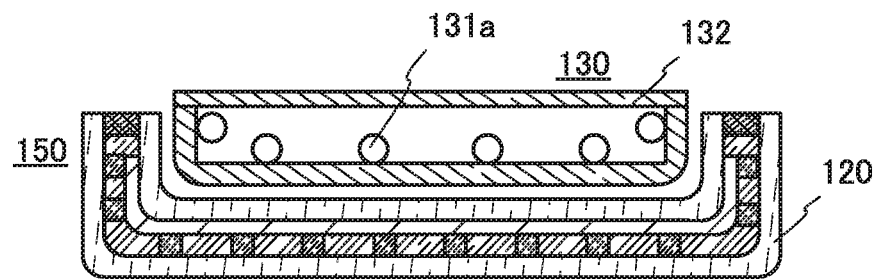
FIGS. 9A and 9B are diagrams each illustrating a liquid crystal display device.
Figure 9B:
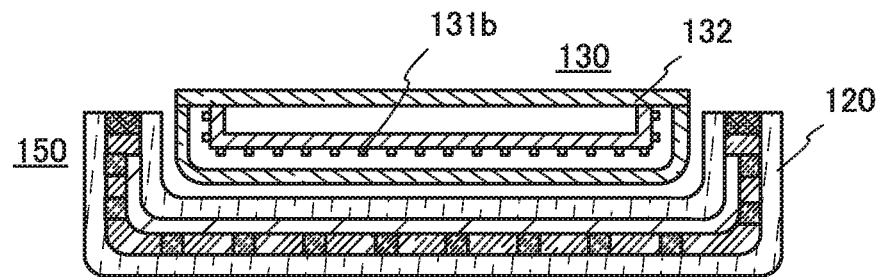

FIGS. 9A and 9B each illustrate an example of the liquid crystal display device provided with a backlight. Note that the liquid crystal display panel 150 shown in Embodiments 1 to 3 is also referred to as a liquid crystal display device. The backlight is placed in a concave formed by the curved region and the flat region of the first substrate 110.

FIG. 9A is the liquid crystal display panel 150 provided with a backlight 130. The backlight 130 includes a cold cathode fluorescent lamp 131a as a light source. The cold cathode fluorescent lamp 131a is disposed in a housing 132 that is curved along the shape of the liquid crystal display panel.

FIG. 9B is also the liquid crystal display panel 150 provided with the backlight 130. The backlight 130 includes an LED 131b as a light source. The LED 131b is disposed in the housing 132 that is curved along the shape of the liquid crystal display panel.

The backlight 130 illustrated in FIGS. 9A and 9B may include a light guide member (component) such as a light-diffusing member (film) or a light-reflecting member (film). The housing 132 includes a light-transmitting portion in a region through which light from the light source passes.

As shown in this embodiment, the optical member is also shaped and arranged so as to be curved in accordance with the shape of the curved liquid crystal display device.

The shape of the liquid crystal display device can be freely determined by selecting the shape of the mold used for shaping the liquid crystal display device. Accordingly, it is possible to manufacture various kinds of liquid crystal display devices capable of being used in a variety of places for a variety of applications, which allows a convenient liquid crystal display device to be provided.

Embodiment 5

In this embodiment, an example in which a plurality of element layers for the liquid crystal display devices shown in Embodiments 1 to 4 are manufactured over a large substrate (a so-called multi-panel technology) will be described with reference to FIGS. 11A1 to 11C2. Therefore, the liquid crystal display device of this embodiment can be manufactured in a manner similar to that shown in Embodiments 1 to 4; thus, description of the same components or components having the same functions as those in Embodiments 1 to 4, and the manufacturing process thereof will be omitted.

As described in the above embodiments, the element layer 101 is formed over the manufacturing substrate 100 and then transferred from the manufacturing substrate 100 to the supporting substrate 102 that is a flexible substrate.

FIGS. 11A1 to 11C2 illustrate a method for transferring a plurality of element layers from a large manufacturing substrate to a supporting substrate. FIGS. 11A2, 11B2, and 11C2 are plan views and FIGS. 11A1, 11B1, and 11C1 are cross-sectional views along line X-Y of FIGS. 11A2, 11B2, and 11C2, respectively.

Element layers 101a, 101b, and 101c are formed over a large manufacturing substrate 180 (see FIGS. 11A1 and 11A2).

A supporting substrate 182 is arranged so as to face the element layers 101a, 101b, and 101c, and the element layers 101a, 101b, and 101c are transferred from the manufacturing substrate 180 to the supporting substrate 182 in a direction indicated by arrows (see FIGS. 11B1 and 11B2).

The supporting substrate 182 is divided into supporting substrates 102a, 102b, and 102c respectively for the element layers 101a, 101b, and 101c (see FIGS. 11C1 and 11C2). There is no particular limitation on a dividing method as long as the supporting substrate can be cut off physically. For example, the supporting substrate 182 can be divided with a dicer or a scriber, or by laser light irradiation.

The element layers 101 (101a, 101b, and 101c) formed over the supporting substrates 102 (102a, 102b, and 102c) for panels are used for manufacturing liquid crystal display devices. The subsequent steps may be performed in a manner similar to those shown in Embodiments 1 to 4.

Such a step of simultaneously transferring a plurality of element layers with use of a large substrate allows a plurality of liquid crystal display devices to be provided at a higher productivity.

Embodiment 6

The invention disclosed in this specification can be applied to a passive matrix liquid crystal display device as well as an active matrix liquid crystal display device.

Thin film transistors are manufactured and used for a pixel portion and further a driver circuit, so that a liquid crystal display device having a display function can be manufactured. In addition, when part or whole of the driver circuit is formed over the same substrate as the pixel portion with use of the thin film transistors, a system-on-panel can be obtained.

The liquid crystal display device includes a liquid crystal element (also referred to as a liquid crystal display element) as a display element.

Furthermore, the liquid crystal display device includes a panel in which the display element is sealed, and a module in which an IC or the like including a controller is mounted on the panel. In this embodiment, liquid crystal display device modules will be illustrated in FIGS. 10A and 10B and FIG. 12.

Note that a liquid crystal display device in this specification refers to an image display device, a display device, or a light source (including a lighting device). Furthermore, the liquid crystal display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by the chip on glass (COG) technique.

Figure 10A:
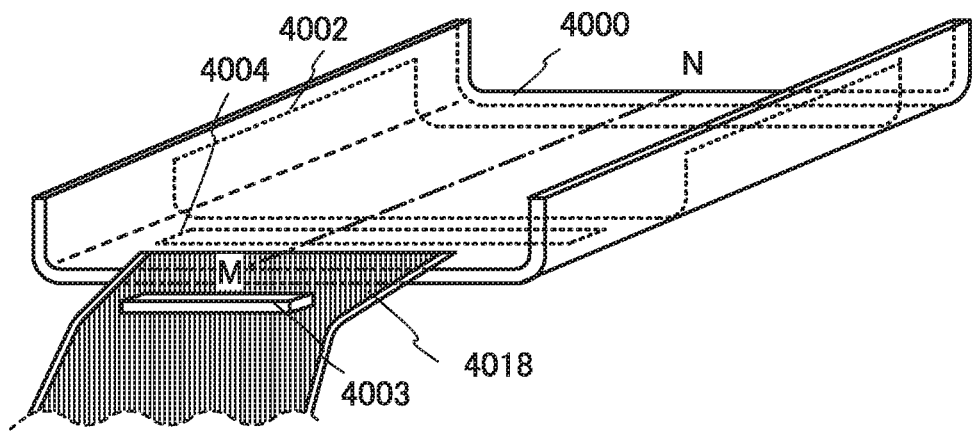
FIGS. 10A and 10B are diagrams each illustrating a liquid crystal display module.
Figure 10B:
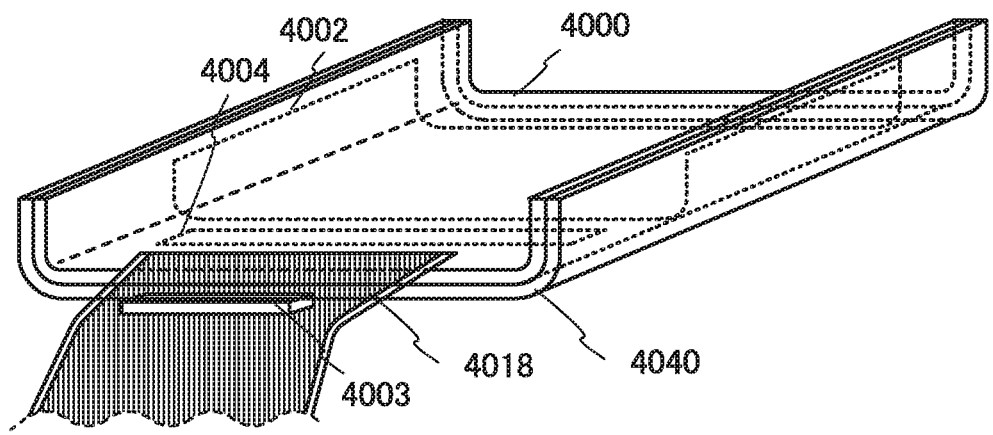
Figure 12:
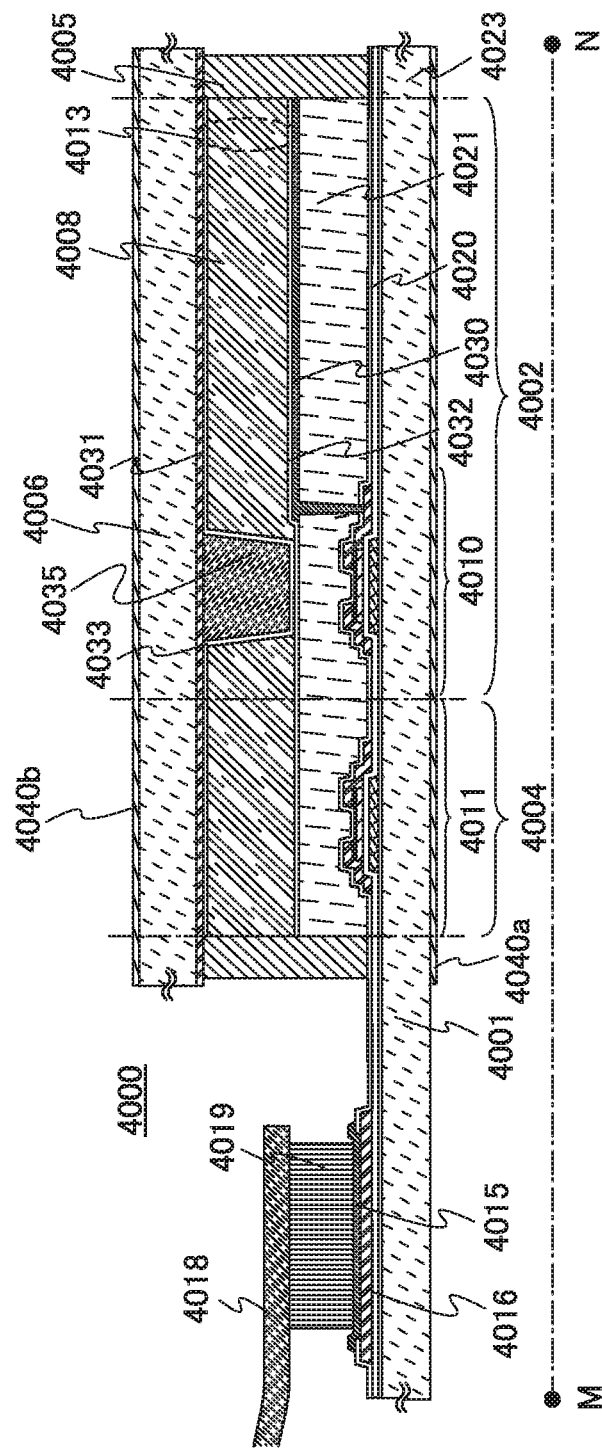
FIG. 12 is a diagram illustrating a liquid crystal display module.
Figure 13A:
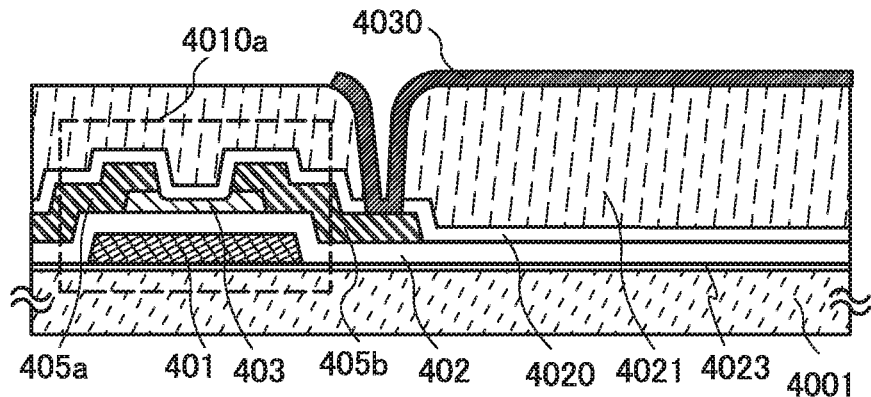
FIGS. 13A to 13D are diagrams each illustrating a semiconductor element that can be used for a liquid crystal display device.
Figure 13B:
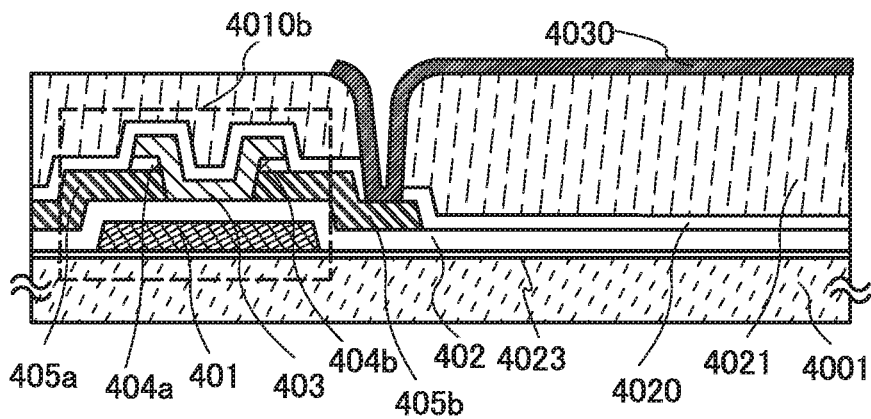
Figure 13C:
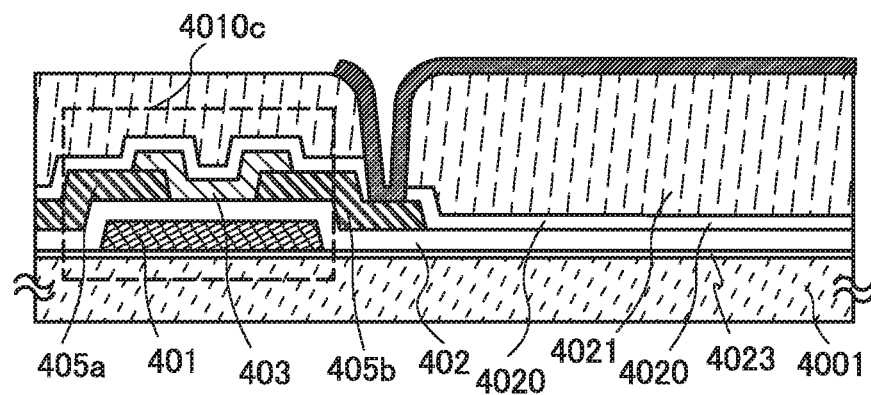
Figure 13D:
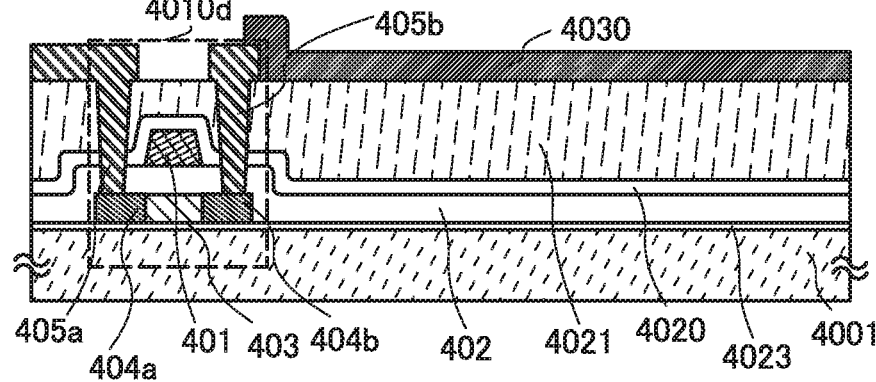

The appearance and cross section of a liquid crystal display panel, which is one embodiment of the liquid crystal display device, will be described with reference to FIGS. 10A and 10B and FIG. 12. FIGS. 10A and 10B and FIG. 12 are examples of liquid crystal display modules in which an FPC 4018 is attached to a liquid crystal display panel 4000. Thin film transistors 4010 and 4011 and a liquid crystal element 4013 are sealed between a first substrate 4001 and a second substrate 4006 with a sealant 4005. FIGS. 10A and 10B are perspective views of the liquid crystal display modules, and FIG. 12 is a cross-sectional view along line M-N of FIG. 10A.

The liquid crystal display module of FIG. 10B shows an example in which the liquid crystal display panel 4000 is attached to a light-transmitting supporting member 4040. The liquid crystal display panel 4000 is provided in contact with an inner surface of the light-transmitting supporting member 4040.

As illustrated in FIGS. 10A and 10B, a pixel portion 4002 serving as a display area is continuously provided on the side surfaces and bottom surface of the liquid crystal display panel that is curved, so that a first display area can be provided on the bottom surface and a second display area can be provided on the side surfaces.

The sealant 4005 is provided to surround the pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006.

A signal line driver circuit 4003 is formed using a single crystal semiconductor film or a polycrystalline semiconductor film over a substrate separately prepared, and is mounted by TAB in a region different from the region surrounded by the sealant.

Further, a variety of signals and potentials are supplied from an FPC 4018 to the signal line driver circuit 4003 that is formed separately, and the scan line driver circuit 4004 or the pixel portion 4002.

Note that there is no particular limitation on the connection method of the driver circuit separately formed, and the driver circuit may be connected by COG, wire bonding, TAB, or the like.

The pixel portion 4002 and the scan line driver circuit 4004 that are provided over the first substrate 4001 each include a plurality of thin film transistors. FIG. 12 illustrates the thin film transistor 4010 included in the pixel portion 4002 and the thin film transistor 4011 included in the scan line driver circuit 4004. Insulating layers 4020 and 4021 are provided over the thin film transistors 4010 and 4011. Note that an insulating film 4023 is an insulating film serving as a base film.

Various kinds of thin film transistors can be applied to the thin film transistors 4010 and 4011 without particular limitation. FIG. 12 illustrates an example in which inverted-staggered thin film transistors having a bottom-gate structure are used as the thin film transistors 4010 and 4011. Although the thin film transistors 4010 and 4011 are channel-etched thin film transistors, they may be channel-protective inverted-staggered thin film transistors in which a channel protective film is provided over a semiconductor layer.

A pixel electrode layer 4030 is provided over the first substrate 4001 and electrically connected to the thin film transistor 4010. The liquid crystal element 4013 includes the pixel electrode layer 4030, a counter electrode layer 4031, and the liquid crystal layer 4008. Insulating films 4032 and 4033 serving as orientation films are provided so that the liquid crystal layer 4008 is interposed therebetween. The counter electrode layer 4031 is provided on the second substrate 4006 side and stacked over the pixel electrode layer 4030 with the liquid crystal layer 4008 interposed therebetween.

The first substrate 4001 and the second substrate 4006 can be made of plastic having light-transmitting properties. A plastic substrate may be a fiberglass-reinforced plastics (FRP) plate, a poly(vinyl fluoride) (PVF) film, a polyester film, or an acrylic resin film. Alternatively, a sheet with a structure in which an aluminum foil is sandwiched between PVF films or polyester films can be used.

Reference numeral 4035 denotes a columnar spacer obtained by selectively etching an insulating film and is provided to control the thickness of the liquid crystal layer 4008 (a cell gap). Alternatively, a spherical spacer may be used.

Although FIG. 12 illustrates an example of a transmissive liquid crystal display device, an embodiment of the present invention can also be applied to a transflective liquid crystal display device.

FIG. 12 illustrates an example of the liquid crystal display device in which a polarizing films 4040*a* and 4040*b* are provided on the outside of the substrates; however, the polarizing films may be provided on the inside of the substrates. The polarizing films may be provided inside or outside the substrate as appropriate depending on materials of the polarizing film or conditions of manufacturing steps. Furthermore, a light-shielding layer serving as a black matrix may be provided.

The insulating layer 4020 serves as a protective film of the thin film transistors.

The protective film (insulating layer 4020) is provided to prevent entry of impurities floating in the air, such as organic substances, metal substances, or moisture, and is preferably a dense film. The protective film (insulating layer 4020) may be formed by sputtering with a single layer or stacked layers of a silicon oxide film, a silicon nitride film, a silicon oxynitride film, a silicon nitride oxide film, an aluminum oxide film, an aluminum nitride film, an aluminum oxynitride film, and/or an aluminum nitride oxide film.

The insulating layer 4021 serving as a planarizing insulating film can be made of an organic material having heat resistance, such as polyimide, an acrylic resin, a benzocyclobutene-based resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films made of these materials.

There is no particular limitation on the method for forming the insulating layer 4021, and the insulating layer 4021 can be formed, depending on the material, by sputtering, spin coating, dipping, spray coating, droplet discharging (e.g., ink-jet, screen printing, or offset printing), roll coating, curtain coating, knife coating, or the like. In the case where the insulating layer 4021 is formed using a material solution, the semiconductor layer may be annealed (at 200° C. to 400° C.) at the same time as a baking step. The baking step of the insulating layer 4020 also serves as the annealing step of the semiconductor layer, whereby a liquid crystal display device can be manufactured efficiently.

In this specification, in the case where the liquid crystal display device is a transmissive liquid crystal display device (or a transflective liquid crystal display device) performing display by transmitting light from a light source, light needs to pass through at least a pixel region. Accordingly, the substrates and the thin films such as insulating films and conductive films existing in the pixel region through which light passes have light-transmitting properties in the visible wavelength range.

The electrode layer (such as a pixel electrode layer, a common electrode layer, or a counter electrode layer) for applying voltage to the liquid crystal layer may have light-transmitting properties or light-reflecting properties depending on the place where the electrode layer is provided or the pattern structure of the electrode layer.

The pixel electrode layer 4030 and the counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The pixel electrode layer 4030 and the counter electrode layer 4031 can also be made of one or more kinds of materials selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of these metals; and a nitride of these metals.

Alternatively, a conductive composition containing a conductive high molecule (also referred to as a conductive polymer) can be used for the pixel electrode layer 4030 and the counter electrode layer 4031. As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

Since the thin film transistors are easily damaged by static electricity or the like, a protective circuit for protecting the driver circuits is preferably provided over the same substrate as a gate line or a source line. It is preferable to use a non-linear element for the protective circuit.

In FIG. 12, a connecting terminal electrode 4015 is formed using the same conductive film as that of the pixel electrode layer 4030, and a terminal electrode 4016 is formed using the same conductive film as that of source and drain electrode layers of the thin film transistors 4010 and 4011.

The connecting terminal electrode 4015 is electrically connected to a terminal included in the FPC 4018 through an anisotropic conductive film 4019.

FIGS. 10A and 10B illustrate an example in which the signal line driver circuit 4003 is formed separately and mounted on the FPC 4018; however, this embodiment is not limited to this structure. The scan line driver circuit may be separately formed and then mounted, or only part of the signal line driver circuit or part of the scan line driver circuit may be separately formed and then mounted.

This embodiment can be implemented in an appropriate combination with the structures described in the other embodiments.

Embodiment 7

There is no particular limitation on the kind of thin film transistor included in the liquid crystal display device disclosed in this specification. Therefore, a variety of structures and materials can be used for the thin film transistor.

Examples of the structure of the thin film transistor will be described with reference to FIGS. 13A to 13D. FIGS. 13A to 13D illustrate examples of the thin film transistor that can be applied to the thin film transistor 4010 in Embodiment 6, and FIGS. 13A to 13D correspond to FIG. 12.

In FIGS. 13A to 13D, the insulating film 4023 is formed over the first substrate 4001, and thin film transistors 4010a, 4010b, 4010c, and 4010d are provided over the insulating film 4023. The insulating layers 4020 and 4021 are formed over each of the thin film transistors 4010a, 4010b, 4010c, and 4010d, and the pixel electrode layer 4030 is provided thereover to be electrically connected to the thin film transistors 4010a, 4010b, 4010c, and 4010d.

The thin film transistor 4010a is an example of the thin film transistor 4010 illustrated in FIG. 12, in which wiring layers 405a and 405b serving as source and drain electrode layers are in contact with a semiconductor layer 403 without an n$^+$ layer interposed therebetween.

The thin film transistor 4010a is an inverted-staggered thin film transistor in which a gate electrode layer 401, a gate insulating layer 402, the semiconductor layer 403, and the wiring layers 405a and 405b serving as source and drain electrode layers are provided over the first substrate 4001 having an insulating surface, and over the insulating film 4023.

The thin film transistor 4010b is a bottom-gate thin film transistor in which the gate electrode layer 401, the gate insulating layer 402, the wiring layers 405a and 405b serving as source and drain electrode layers, n$^+$ layers 404a and 404b serving as source and drain regions, and the semiconductor layer 403 are provided over the first substrate 4001 having an insulating surface, and over the insulating film 4023. In addition, an insulating film 4020 is provided in contact with the semiconductor layer 403 so as to cover the thin film transistor 4010b. The n$^+$ layers 404a and 404b are semiconductor layers each having a lower resistance than the semiconductor layer 403.

The n$^+$ layers 404a and 404b may be provided between the gate insulating layer 402 and the wiring layers 405a and 405b. Alternatively, the n$^+$ layers may be provided both between the gate insulating layer and the wiring layers and between the wiring layers and the semiconductor layer.

The gate insulating layer 402 exists in the entire region including the thin film transistor 4010b, and the gate electrode layer 401 is provided between the gate insulating layer 402 and the first substrate 4001 having an insulating surface. The wiring layers 405a and 405b and the n$^+$ layers 404a and 404b are provided over the gate insulating layer 402. Then, the semiconductor layer 403 is provided over the gate insulating layer 402, the wiring layers 405a and 405b, and the n$^+$ layers 404a and 404b. Although not illustrated, a wiring layer is provided over the gate insulating layer 402 in addition to the wiring layers 405a and 405b, and the wiring layer extends beyond the perimeter of the semiconductor layer 403.

The thin film transistor 4010c has another structure of the thin film transistor 4010b, in which source and drain electrode layers are in contact with a semiconductor layer without an n$^+$ layer interposed therebetween.

The gate insulating layer 402 exists in the entire region including the thin film transistor 4010c, and the gate electrode layer 401 is provided between the gate insulating layer 402 and the first substrate 4001 having an insulating surface. The wiring layers 405a and 405b are provided over the gate insulating layer 402. Then, the semiconductor layer 403 is provided over the gate insulating layer 402 and the wiring layers 405a and 405b. Although not illustrated, a wiring layer is provided over the gate insulating layer 402 in addition to the wiring layers 405a and 405b, and the wiring layer extends beyond the perimeter of the semiconductor layer 403.

The thin film transistor 4010d is a top-gate thin film transistor and an example of a planar thin film transistor. The semiconductor layer 403 including the n$^+$ layers 404a and 404b serving as source and drain regions is formed over the first substrate 4001 having an insulating surface, and over the insulating film 4023. The gate insulating layer 402 is formed over the semiconductor layer 403, and the gate electrode layer 401 is formed over the gate insulating layer 402. In addition, the wiring layers 405a and 405b serving as source and drain electrode layers are formed in contact with the n$^+$ layers 404a and 404b. The n$^+$ layers 404a and 404b are semiconductor regions each having a lower resistance than the semiconductor layer 403.

The thin film transistor may be a top-gate forward-staggered thin film transistor.

Although a single-gate transistor is described in this embodiment, a multi-gate transistor such as a double-gate transistor may also be used. In that case, a gate electrode layer may be provided above and below the semiconductor layer, or a plurality of gate electrode layers may be provided only on one side of (above or below) the semiconductor layer.

There is no particular limitation on the semiconductor material used for the semiconductor layer. Examples of the material used for the semiconductor layer of the thin film transistor will be described below.

As a material for the semiconductor layer included in the semiconductor element, it is possible to use an amorphous semiconductor (hereinafter, also referred to as an AS) that is formed by sputtering or vapor-phase growth using a semiconductor material gas typified by silane or germane, a polycrystalline semiconductor that is obtained by crystallizing the amorphous semiconductor by utilizing light energy or thermal energy, a microcrystalline semiconductor (also referred to as a semi-amorphous or microcrystal semiconductor, and hereinafter, also referred to as an SAS), or the like. The semiconductor layer can be deposited by sputtering, LPCVD, plasma CVD, or the like.

Considering Gibbs free energy, the microcrystalline semiconductor film is in a metastable state that is intermediate between an amorphous state and a single crystal state. That is, the microcrystalline semiconductor is in a third state that is thermodynamically stable, and has short-range order and lattice distortion. Columnar or needle-like crystals grow in the direction of the normal to the surface of the substrate. The Raman spectrum of microcrystalline silicon, which is a typical example of a microcrystalline semiconductor, is shifted to a lower wavenumber side than 520 cm$^{-1}$ that represents single crystal silicon. In other words, the Raman spectrum of microcrystalline silicon has a peak between 520 cm$^{-1}$ that represents single crystal silicon and 480 cm$^{-1}$ that represents amorphous silicon. Furthermore, the microcrystalline semiconductor film contains 1 atomic % or more of hydrogen or halogen to terminate dangling bonds. The microcrystalline semiconductor film may further contain a rare gas element such as helium, argon, krypton, or neon to further promote lattice distortion, whereby a favorable microcrystalline semiconductor film with improved stability can be obtained.

This microcrystalline semiconductor film can be formed by a high-frequency plasma CVD method with a frequency of several tens of megahertz to several hundreds of megahertz, or a microwave plasma CVD apparatus with a frequency of 1 GHz or more. Typically, the microcrystalline semiconductor film can be formed using silicon hydride, such as $SiH_4$, $Si_2H_6$, $SiH_2Cl_2$, or $SiHCl_3$, or silicon halide such as $SiCl_4$ or $SiF_4$, which is diluted with hydrogen. Furthermore, the microcrystalline semiconductor film can be formed with a gas containing silicon hydride and hydrogen which is diluted by one or more kinds of rare gas elements selected from helium, argon, krypton, and neon. In such a case, the flow rate ratio of hydrogen to silicon hydride is set to 5:1 to 200:1, preferably, 50:1 to 150:1, and more preferably, 100:1.

The amorphous semiconductor is typified by hydrogenated amorphous silicon, and the crystalline semiconductor is typified by polysilicon or the like. Polysilicon (polycrystalline silicon) includes so-called high-temperature polysilicon that contains polysilicon formed at a process temperature of 800° C. or higher as its main component, so-called low-temperature polysilicon that contains polysilicon formed at a process temperature of 600° C. or lower as its main component, and polysilicon formed by crystallizing amorphous silicon by using, for example, an element that promotes crystallization. It is needless to say that a microcrystalline semiconductor or a semiconductor partially including a crystalline phase can also be used as described above.

As a semiconductor material, a compound semiconductor such as GaAs, InP, SiC, ZnSe, GaN, or SiGe as well as silicon (Si) or germanium (Ge) alone can be used.

In the case of using a crystalline semiconductor film for the semiconductor layer, the crystalline semiconductor film may be manufactured by various methods (e.g., laser crystallization, thermal crystallization, or thermal crystallization using an element such as nickel that promotes crystallization). Alternatively, a microcrystalline semiconductor, which is an SAS, may be crystallized by laser irradiation to increase crystallinity. In the case where an element that promotes crystallization is not introduced, before being irradiated with laser light, an amorphous semiconductor film is heated at 500° C. for one hour in a nitrogen atmosphere, whereby hydrogen contained in the amorphous semiconductor film is eliminated to allow its concentration to be $1\times10^{20}$ atoms/cm$^3$ or less. This is because, if the amorphous semiconductor film contains much hydrogen, the amorphous semiconductor film is broken by laser irradiation.

In the case of the crystallization of the amorphous semiconductor film using the element that promotes crystallization, it is possible to use one or more kinds of metal elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au). There is no particular limitation on a method for introducing the metal element into the amorphous semiconductor film as long as the metal element can exist on the surface of or inside the amorphous semiconductor film. For example, sputtering, CVD, plasma processing (including plasma CVD), an adsorption method, or a method of applying a metal-salt solution can be employed. Among them, the method using a solution is simple and easy, and is useful in terms of easy concentration adjustment of the metal element. At this time, an oxide film may be deposited at the surface of the amorphous semiconductor film by UV light irradiation in an oxygen atmosphere, thermal oxidation, treatment with ozone-containing water or hydrogen peroxide including a hydroxyl radical, or the like in order to improve its wettability and to spread the solution containing the metal salt on the entire surface of the amorphous semiconductor film.

In the crystallization of the amorphous semiconductor film using the element that promotes crystallization, heat treatment (at 550° C. to 750° C. for 3 minutes to 24 hours) may be performed.

In order to remove or reduce the element that promotes crystallization of the crystalline semiconductor film, a semiconductor film containing an impurity element is formed in contact with the crystalline semiconductor film so as to function as a gettering sink. As the impurity element, an impurity element imparting n-type conductivity, an impurity element imparting p-type conductivity, a rare gas element, or the like can be used. For example, it is possible to use one or more kinds of elements selected from phosphorus (P), nitrogen (N), arsenic (As), antimony (Sb), bismuth (Bi), boron (B), helium (He), neon (Ne), argon (Ar), krypton (Kr), and xenon (Xe). A semiconductor film containing a rare gas element is formed in contact with the crystalline semiconductor film containing the element that promotes crystallization, and then heat treatment is performed (at 550° C. to 750° C. for 3 minutes to 24 hours). The element promoting crystallization that is contained in the crystalline semiconductor film moves into the semiconductor film containing a rare gas element, and thus the element promoting crystallization that is contained in the crystalline semiconductor film is removed or reduced. After that, the semiconductor film containing a rare gas element, which has functioned as a gettering sink, is removed.

The amorphous semiconductor film may be crystallized by a combination of thermal treatment and laser light irradiation. Alternatively, either thermal treatment or laser light irradiation may be performed plural times.

A crystalline semiconductor film can also be formed directly over the substrate by a plasma method. Alternatively, a crystalline semiconductor film may be selectively formed over the substrate by a plasma method.

It is also possible to use an oxide semiconductor such as zinc oxide (ZnO) or tin oxide ($SnO_2$) for the semiconductor layer. In the case of using ZnO for the semiconductor layer, a gate insulating layer is formed of $Y_2O_3$, $Al_2O_3$, $TiO_2$, a stack thereof, or the like, and a gate electrode layer, a source electrode layer, and a drain electrode layer can be formed of ITO, Au, Ti, or the like. In addition, In, Ga, or the like may be added to ZnO.

As the oxide semiconductor, a thin film represented by $InMO_3(ZnO)_m$ (m>0) can be used. Note that M denotes one or more of metal elements selected from gallium (Ga), iron (Fe), nickel (Ni), manganese (Mn), and cobalt (Co). For example, M is gallium (Ga) in some cases, and in other cases, M contains other metal elements in addition to Ga, such as Ga and Ni or Ga and Fe. Furthermore, the above oxide semiconductor may contain another transition metal or an oxide of the transition metal as an impurity element. For example, an In—Ga—Zn—O-based non-single-crystal film can be used as the oxide semiconductor layer.

An oxide semiconductor layer $(InMO_3(ZnO)_m$ film (m>0)) in which M is another metal element may be used instead of the In—Ga—Zn—O-based non-single-crystal film.

This embodiment can be implemented in an appropriate combination with the structures described in the other embodiments.

Embodiment 8

A liquid crystal display device disclosed in this specification can be applied to a variety of electronic appliances (including an amusement machine). Examples of electronic appliances include a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio reproducing device, and a large-sized game machine such as a pachinko machine.

In this embodiment, an example of a cellular phone using the liquid crystal display device disclosed in this specification will be described with reference to FIGS. 14A to 14D and FIG. 15.

FIG. 14C is a front view of the cellular phone; FIG. 14D, a side view; and FIG. 14B, a top view. The cellular phone includes a housing 1411a and a housing 1411b, which include a light-transmitting supporting member at least in a region where display is performed. FIG. 14A is a cross-sectional view of the inside of the housing 1411a and the housing 1411b. The front of the housing 1411a has a rectangular shape with a longer side and a shorter side, which may have a round corner. In this embodiment, the direction parallel to the longer side of the rectangle that is the front shape is referred to as a longitudinal direction, and the direction parallel to the shorter side is referred to as a lateral direction.

The sides of the housing 1411a and the housing 1411b also have a rectangular shape with a longer side and a shorter side, which may have a round corner. In this embodiment, the direction parallel to the longer side of the rectangle that is the side shape is referred to as a longitudinal direction, and the direction parallel to the shorter side is referred to as a depth direction.

The cellular phone illustrated in FIGS. 14A to 14D includes a display area 1413, operating buttons 1404, and a touch screen 1423, and the housings 1411a and 1411b include a liquid crystal display panel 1421, a backlight 1424, and a wiring board 1425. The touch screen 1423 may be provided as needed.

As the liquid crystal display panel 1421, the liquid crystal display panel and the liquid crystal display module described in Embodiments 1 to 7 may be used.

As illustrated in FIGS. 14B and 14C, the liquid crystal display panel 1421 is arranged along the shape of the housing 1411a so as to cover not only the front area on the viewer side but also parts of the top area and the bottom area. Accordingly, a display area 1427 can be formed on the top of the cellular phone in the lateral direction to be connected to the display area 1413. That is, the display area 1427 is provided on the top surface of the cellular phone, which makes it possible to see the display area 1427 without taking out the cellular phone from, for example, the breast pocket.

On the display areas 1413 and 1427, incoming mails or calls, dates, phone numbers, personal names, and the like may be displayed. Display may be performed only in the display area 1427 and not be performed in the other regions as needed, resulting in saving of energy.

Figure 15:
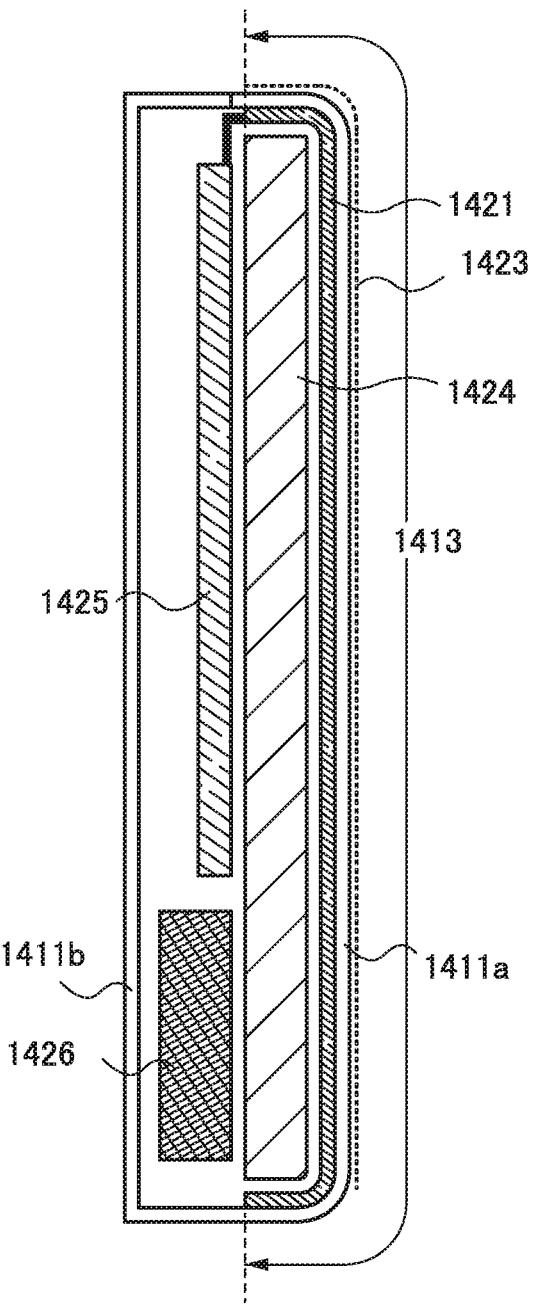
FIG. 15 is a diagram illustrating an example of a cellular phone using a liquid crystal display device.

FIG. 15 is a cross-sectional view of FIG. 14D. As illustrated in FIG. 15, the liquid crystal display panel 1421 is continuously provided on the top, front, and bottom of the inside of the housing 1411a. The backlight 1424, the wiring board 1425 electrically connected to the liquid crystal display panel 1421, and a battery 1426 are provided on the back side of the liquid crystal display panel 1421. Furthermore, the touch screen 1423 is provided on the outside of the housing 1411a (on the viewer side).

Images and letters can be displayed on the cellular phone of this embodiment, whether it is placed horizontally or vertically for a landscape mode or a portrait mode.

The liquid crystal display panel 1421 is not manufactured separately in the front area and the top area, but manufactured to cover both the front display area 1413 and the top display area 1427, resulting in a reduction in manufacturing cost and time.

The touch screen 1423 is provided on the housing 1411a, and buttons 1414 on the touch screen are displayed on the display area 1413. By touching the buttons 1414 with a finger or the like, contents displayed on the display area 1413 can be changed. Furthermore, making calls or composing mails can also be performed by touching the buttons 1414 on the display area 1413 with a finger or the like.

The buttons 1414 on the touch screen 1423 may be displayed when needed, and when the buttons 1414 are not necessary, images or letters can be displayed on the entire display area 1413.

A longer side of the top cross section of the cellular phone may have a radius of curvature. When the top cross section has a longer side with a radius of curvature, each of the liquid crystal display panel 1421 and the touch screen 1423 also has a top cross section having a longer side with a radius of curvature. Furthermore, the housing 1411a is also curved. That is, the display area 1413 is curved outwards when seen from the front.

This application is based on Japanese Patent Application serial No. 2009-093392 filed with Japan Patent Office on Apr. 7, 2009, the entire contents of which are hereby incorporated by reference.

What is claimed is:
1. An electronic appliance comprising:
 a light-transmitting supporting member including a flat region and curved regions extending from both ends of the flat region;
 a display panel including a first display region overlapping with the flat region and a second display region overlapping with the curved regions;
 a wiring board electrically connected to the display panel; and
 a battery electrically connected to the display panel and not overlapping with the wiring board when seen from the front,
 wherein the display panel is attached to the light-transmitting supporting member with an adhesive layer, and
 wherein a shape of the electronic appliance when seen from the side is a rectangular shape with a round corner.

2. The electronic appliance according to claim 1, wherein each of the first display region and the second display region has a function of displaying an image or a letter.

3. The electronic appliance according to claim 1, wherein the battery is provided below the wiring board when the electronic appliance is seen from the front.

* * * * *